US007027476B2

(12) United States Patent
Taghavi-Larigani et al.

(10) Patent No.: US 7,027,476 B2
(45) Date of Patent: Apr. 11, 2006

(54) TUNABLE SEMICONDUCTOR LASERS

(75) Inventors: Shervin Taghavi-Larigani, Pasadena, CA (US); Jakob J. Vanzyl, Pasadena, CA (US); Amnon Yariv, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 218 days.

(21) Appl. No.: 10/638,763

(22) Filed: Aug. 11, 2003

(65) Prior Publication Data

US 2004/0032886 A1 Feb. 19, 2004

Related U.S. Application Data

(60) Provisional application No. 60/402,589, filed on Aug. 9, 2002, provisional application No. 60/406,428, filed on Aug. 28, 2002, provisional application No. 60/428,348, filed on Nov. 22, 2002, provisional application No. 60/435,110, filed on Dec. 19, 2002.

(51) Int. Cl.
*H01S 3/10* (2006.01)

(52) U.S. Cl. .......................................... 372/50; 372/20

(58) Field of Classification Search ...................... 372/5
See application file for complete search history.

(56) References Cited

U.S. PATENT DOCUMENTS 5,396,511 A   3/1995  Nakatsuka et al. ........... 372/43

| 5,398,256 | A | * | 3/1995 | Hohimer et al. | 372/94 |
| 5,408,492 | A | * | 4/1995 | Vossler et al. | 372/94 |
| 5,717,708 | A | * | 2/1998 | Mells | 372/32 |
| 5,956,355 | A | * | 9/1999 | Swanson et al. | 372/20 |
| 6,393,186 | B1 | * | 5/2002 | Deacon | 385/50 |

FOREIGN PATENT DOCUMENTS

EP         01024482       1/1989
WO     WO 02/08815 A1    1/2002

OTHER PUBLICATIONS

N. Bar-Chaim et al., "Half-ring geometry quantum well GaAlAs lasers," Applied Physics Letters, American Institute of Physics, New York, US, Sep. 3, 1990, 57(10):966-967.
Amann, M. et al., "Tunable Laser Diodes," Artech House Publishers, pp. 37-44, and pp. 106-108, Aug. 1998.
Borchert, B., et al., "Vertically integrated Mach-Zehnder interferometer (VMZ) widely tunable laser diode with improved wavelength access," Electronics Letters, vol. 30, No. 24, pp. 2047-2049, Nov. 24, 1994.

(Continued)

*Primary Examiner*—James Vannucci
(74) *Attorney, Agent, or Firm*—Origin Law; Bradley K. Lortz

(57) ABSTRACT

Tunable semiconductor lasers are disclosed requiring minimized coupling regions. Multiple laser embodiments employ ring resonators or ring resonator pairs using only a single coupling region with the gain medium are detailed. Tuning can be performed by changing the phase of the coupling coefficient between the gain medium and a ring resonator of the laser. Another embodiment provides a tunable laser including two Mach-Zehnder interferometers in series and a reflector coupled to a gain medium.

18 Claims, 21 Drawing Sheets

OTHER PUBLICATIONS

Coldren, L.A., et al., "Diode Lasers and Photonics Integrated Circuits," John Wiley & Sons, Inc., pp. 42, 45 and 107, 1995.

Kuznetsov, M., et al., "Widely Tunable (45 nm, 5.6 THz) Multi-Quantum-Well Three-Branch Y3-Lasers for WDM Networks," IEEE Photonics Technology Letters, vol. 5, No. 8, pp. 879-882, Aug. 1993.

Liu, Bin et al., "Wide Tunable Double Ring Resonator Coupled Lasers," IEEE Photonics Technology Letters, vol. 14, No. 5, pp. 600-602, May 2002.

Yariv, A., "Universal relations for coupling of optical power between microresonators and dielectric waveguides," Electronics Letters, vol. 36, No. 4, pp. 321-322, Feb. 17, 2000.

* cited by examiner

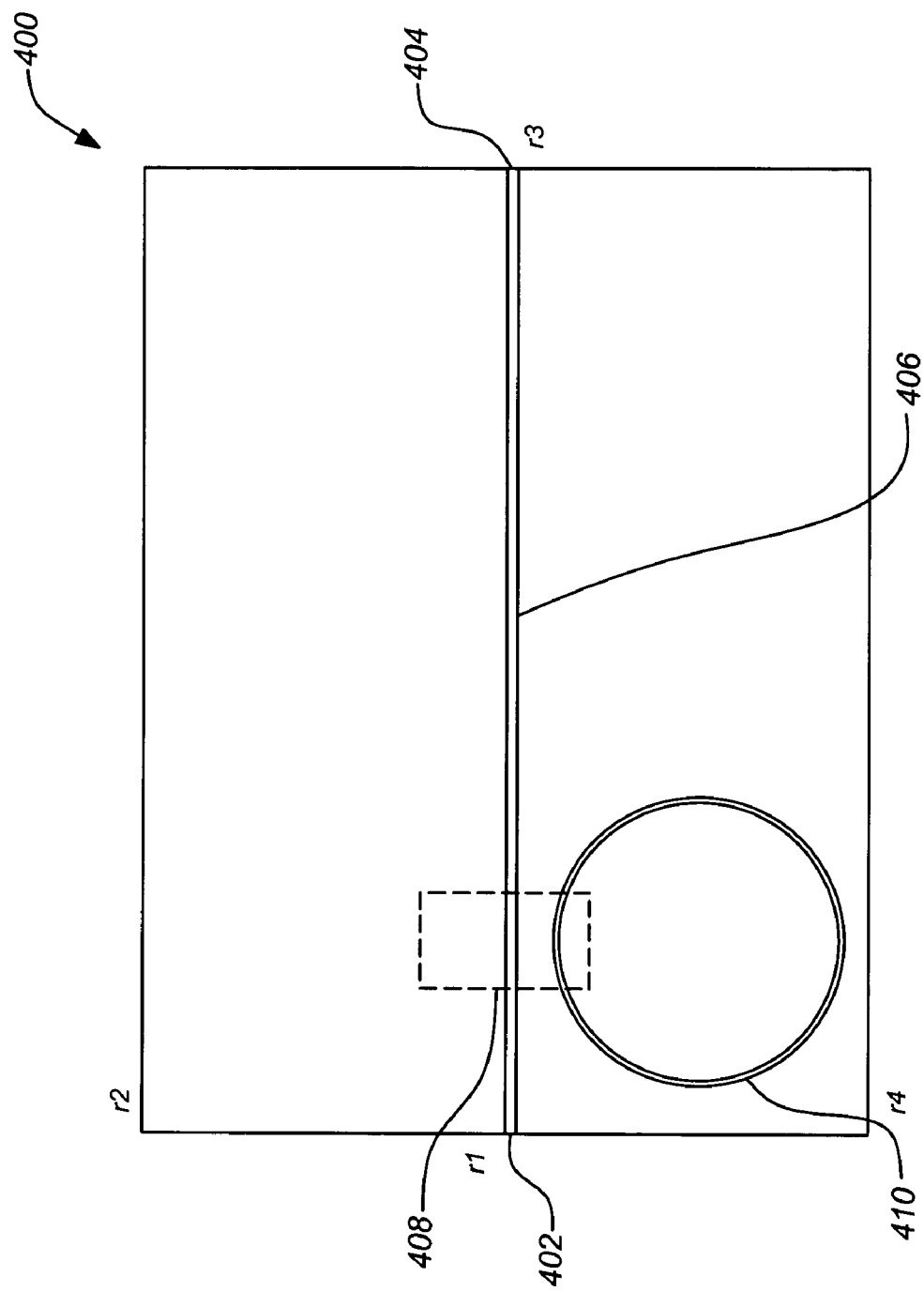

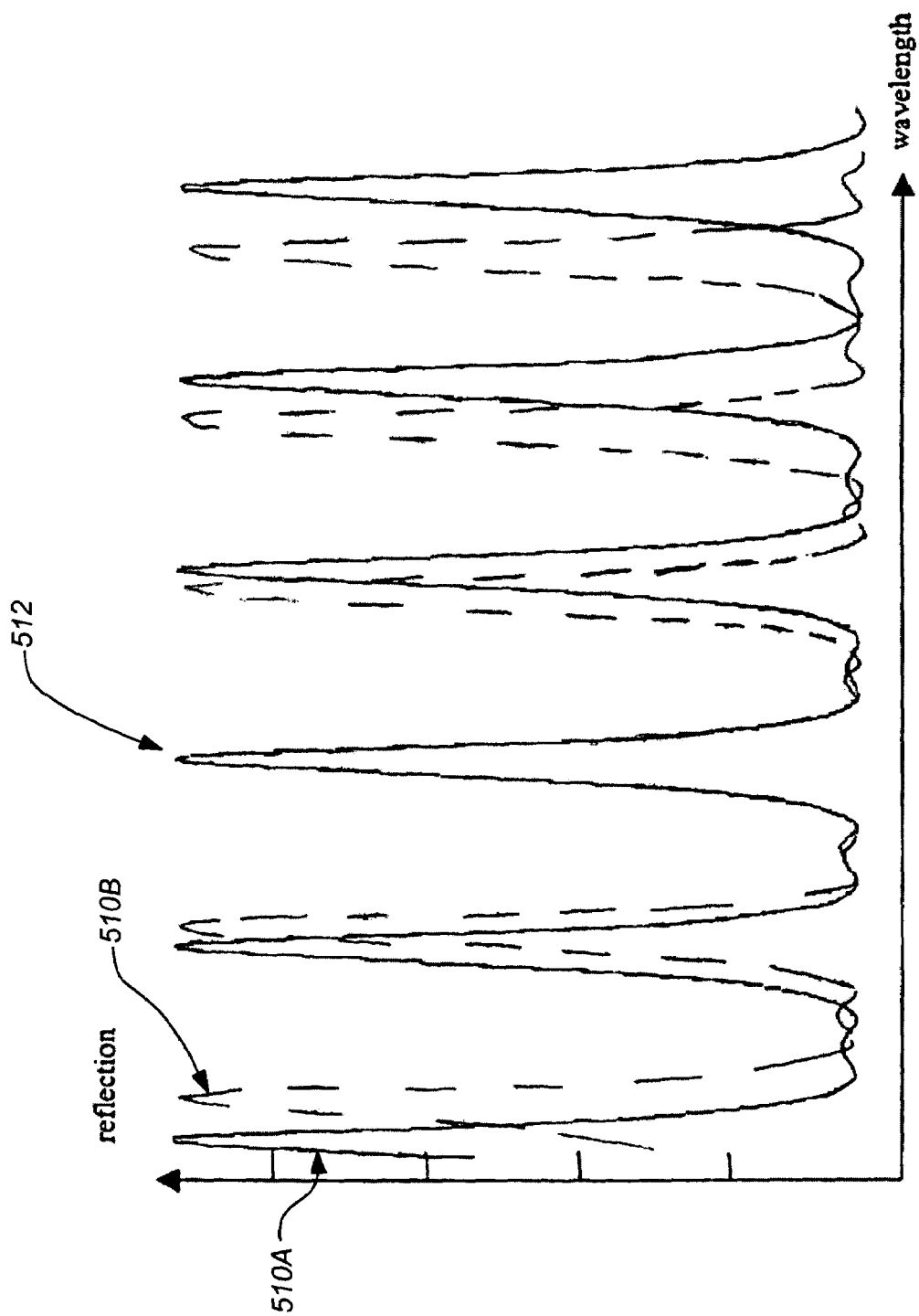

TUNABLE SEMICONDUCTOR LASERS

CROSS-REFERENCE TO RELATED APPLICATIONS

This application claims the benefit under 35 U.S.C. §119 (e) of the following U.S. Provisional Patent Applications, which are all incorporated by reference herein:

U.S. Provisional Application Serial No. 60/402,589, filed Aug. 9, 2002, by Shervin Taghavi, entitled "NOVEL HYBRID WIDE TUNABLE SEMICONDUCTOR LASER USING MACH-ZEHNDER INTERFEROMETERS"

U.S. Provisional Application Ser. No. 60/406,428, filed Aug. 28, 2002, by Shervin Taghavi et al., entitled "NOVEL TUNABLE SEMICONDUCTOR LASERS BASED ON THE COMBINATION OF TWO RESONATORS"

U.S. Provisional Application Ser. No. 60/428,348, filed Nov. 22, 2002, by Shervin Taghavi et al., entitled "NOVEL TUNABLE SEMICONDUCTOR LASERS BASED ON THE COMBINATION OF TWO RESONATORS"

U.S. Provisional Application Ser. No. 60/435,110, filed Dec. 19, 2002, by Shervin Taghavi et al., entitled "NOVEL TUNABLE SEMICONDUCTORS USING RING RESONATOR AND BACK REFLECTION"

This application is related to the following co-pending U.S. Patent Application, which is incorporated by reference herein:

U.S. application Ser. No. 10/610,292, filed Jun. 30, 2003, by Shervin Taghavi et al. and entitled "OPTICAL RESONATOR AND LASER APPLICATIONS".

STATEMENT OF GOVERNMENT RIGHTS

The invention described herein was made in the performance of work under a NASA contract, and is subject to the provisions of Public Law 96-517 (35 U.S.C. 202) in which the Contractor has elected to retain title.

BACKGROUND OF THE INVENTION

1. Field of the Invention

The present invention relates to optical devices and methods for producing and operating them. Particularly, the present invention relates to novel architectures of tunable semiconductor lasers.

2. Description of the Related Art

In recent years, the development of optical devices for various applications such as tunable semiconductor lasers has received much attention. For example, fiber optic communication systems employ widely tunable semiconductor lasers in wavelength division multiplexing applications. Accordingly, various forms of tunable semiconductor lasers and related devices have been developed.

Many of the developed tunable semiconductor lasers require relatively complex manufacturing processes and may employ grating structures and/or moving components. In addition, multiple optical couplers in many tunable semiconductor lasers can reduce the overall performance, such as indicated by the mode suppression ration (MSR).

Two fundamental types of optical resonators are the Fabry-Perot cavity and the ring resonator. The Fabry-Perot cavity comprise two parallel reflective planes separated by a distance. Resonance (constructive interference of the reflected light) occurs for specific wavelengths of light reflected when the reflective planes when the distance between the planes is an even multiple of the light wavelength. Thus, the pattern for resonance is periodic across wavelengths. Reflective gratings have also been used in the place of the reflective planes achieve similar results. In addition, ring resonators establish resonance in a similar manner, but the critical distance is defined by the circumference of circular waveguide rather than the separation between two reflective planes. Both fundamental types of optical resonators have been used in a vast number of various optical devices such as tunable lasers. However, both types present different manufacturing and design difficulties in their use. For example, conventional Fabry-Perot resonators are typically constrained (or are constrained by) other device parameters, e.g., the gain medium length must coincide with the length of the Fabry-Perot cavity. The use of ring resonators is often complicated by the need for multiple coupling regions.

The need for optical resonators which are simple to manufacture and can be used in the production of optical devices such as tunable semiconductor lasers has been addressed in related U.S. patent application Ser. No. 10/610, 292, filed Jun. 30, 2003, by Shervin Taghavi et al. and entitled "OPTICAL RESONATOR AND LASER APPLICATIONS" which is incorporated by reference herein.

There is a also need for semiconductor laser designs which employ a reduced coupling region even without a novel optical resonator. There is a further a need for such tunable semiconductor lasers which operate without grating structures or moving components and are simple to manufacture. As detailed hereafter, the present invention possesses these and other advantages.

SUMMARY OF THE INVENTION

The present invention discloses some novel tunable semiconductor lasers. Embodiments of the invention have the advantage of requiring only simple planar fabrication technology. Thus, embodiments of the invention require no grating structure or moving parts. Using a complex field approach, it can be demonstrated that relatively wide tunability, high optical power and a large mode suppression ratio (MSR) can be achieved through a careful design employing a simple architecture. The MSR exhibited by embodiments of the invention (even in the case of low, e.g. approximately 3 dB, coupling between the gain chip and the tunable mirror) is still higher than that obtained with standard designs of tunable lasers based on interferometer techniques. Such standard designs exhibit typical MSRs around 30 dB to 40 dB.

Various embodiments of the present invention employ ring resonators each having only a single coupling region with the gain medium. Other embodiments employ one or more pairs of ring resonators, each pair using a single coupling region. These lasers can be tuned through a variety methods. For example, tuning can be performed by changing the phase of the coupling coefficient between the gain medium and a ring resonator of the laser.

In one ring resonator laser embodiment of the invention, a tunable laser comprises a semiconductor medium having a front facet and a rear facet and including a lasing cavity. A gain medium is disposed within the cavity of the semiconductor medium for amplifying light. A ring resonator is disposed within the semiconductor medium adjacent to the gain medium and a single coupling region for coupling the light between the gain medium and the ring resonator, the single coupling region disposed within the semiconductor medium. A reflection from the ring resonator including a back reflection from the rear facet is tuned to the lasing cavity to produce lasing light from the front facet. In a further embodiment, an additional ring resonator is coupled to the coupling region and a response from the additional ring resonator is included in the reflection to produce lasing light from the front facet.

In a further embodiment of the invention a tunable semiconductor lasers uses the Vernier technique where the two ring resonators are disposed on opposite sides of a gain medium. This embodiment includes the elements of the one ring resonator laser above, however an opposing ring resonator is disposed within the semiconductor medium adjacent to the gain medium towards an opposite end of the gain medium and a opposing single coupling region for coupling the light between the gain medium and the opposing ring resonator, the opposing single coupling region disposed within the semiconductor medium. The laser is tuned employing a Vernier technique between the ring resonator and the opposing ring resonator. In further embodiments, one or both of the ring resonator and opposing ring resonator can be a ring resonator pair coupled to the same coupling region.

In addition, another embodiment of the invention provides a tunable laser comprising two reflector elements coupled to a gain medium. A typical embodiment comprises a gain medium for amplifying light across a gain bandwidth and a semiconductor medium including a first reflector element coupled to receive light from the gain medium and comprising a first Mach-Zehnder interferometers (MZI) and a second MZI coupled in series and a second reflector element for receiving light from the first reflector element and returning the light to the first reflector element. The first MZI has a larger free spectral range than the second MZI. The first MZI selects a wavelength region within the gain bandwidth and the second MZI selects a cavity mode within the wavelength region for producing lasing light at the cavity mode.

BRIEF DESCRIPTION OF THE DRAWINGS

Referring now to the drawings in which like reference numbers represent corresponding parts throughout:

FIG. 4A illustrates a laser including a single ring resonator;

FIG. 5B illustrates the Vernier effect;

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

1. Semi-Ring Fabry-Perot Resonator

Figure 1A:
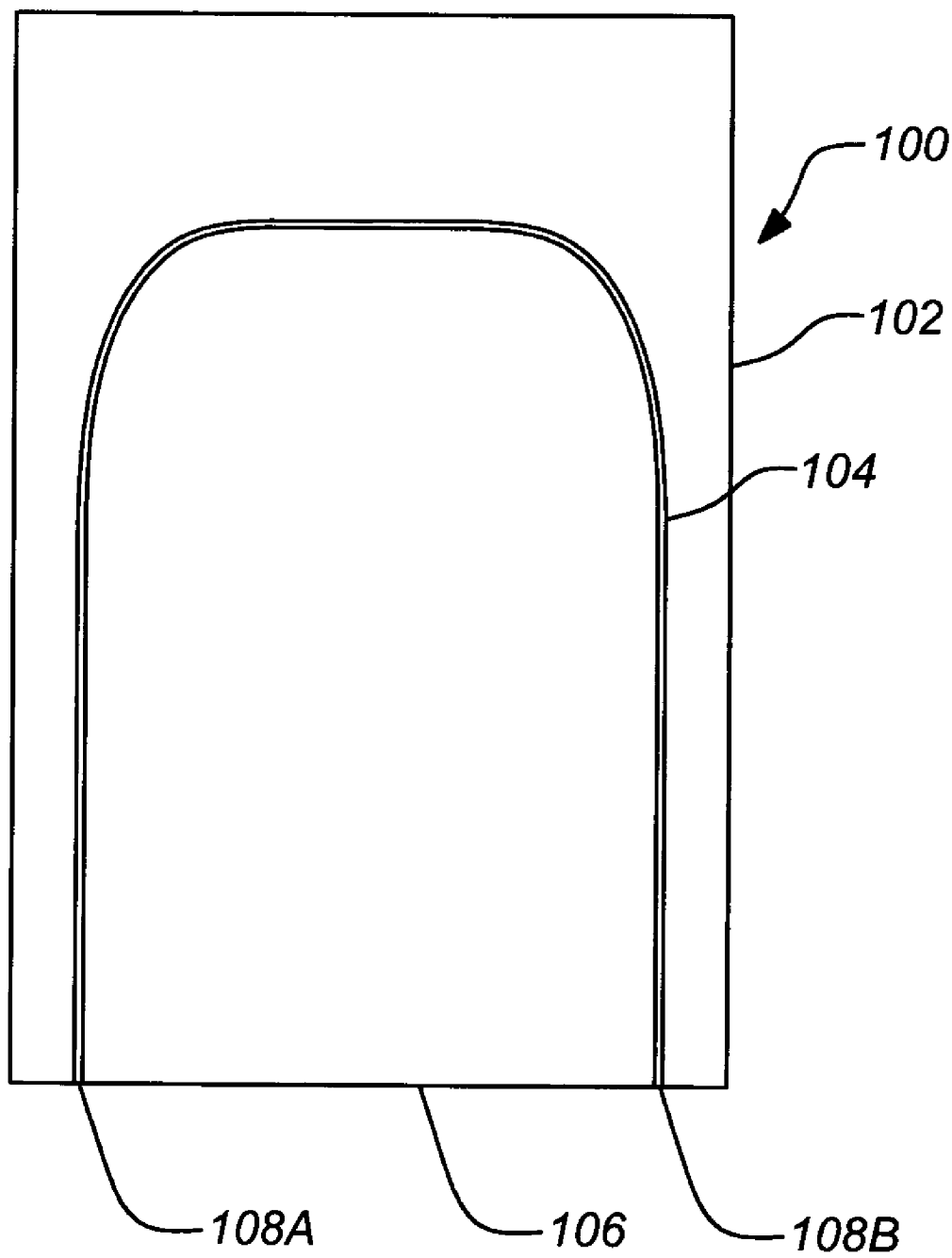
FIG. 1A illustrates a top view of a SRFP optical resonator.

FIG. 1A illustrates an optical resonator that has previously present in related U.S. patent application Ser. No. 10/610, 292, filed Jun. 30, 2003, by Shervin Taghavi et al. and entitled "OPTICAL RESONATOR AND LASER APPLICATIONS" which is incorporated by reference herein. The resonator 100, a semi-ring Fabry-Perot (SRFP) resonator 100, comprises a medium 102 (such as a semiconductor material) including an edge forming a reflective facet 106 and a waveguide 104 within the medium, the waveguide having opposing ends 108A, 108B formed by the reflective facet 106. The resonator 100 behaves similar to a Fabry-Perot resonator with some additional advantageous properties. For example, manufacturing of the resonator 100 is simplified because only a single facet 106 is cut to produce the functional resonator cavity. In addition, due to this simplicity, the range of applications for a resonator 100 based on only a single facet 106 is also broader than for resonators requiring multiple facets; only one free facet is required to tune the resonator 100 in isolation from other elements of a given optical device. This optical element can be used in a variety of optical devices, and is particularly useful in tunable laser applications. The optical resonator also has the advantage of a planar fabrication and not of requiring any grating structure or moving parts.

The resonator can be employed as a tunable element by constructing the waveguide 104 (or a portion thereof) such that the optical length is varied by controlled current injection as is known in the art. The current injection changes the index of refraction and therefore the optical length as the device is operated.

Figure 1B:
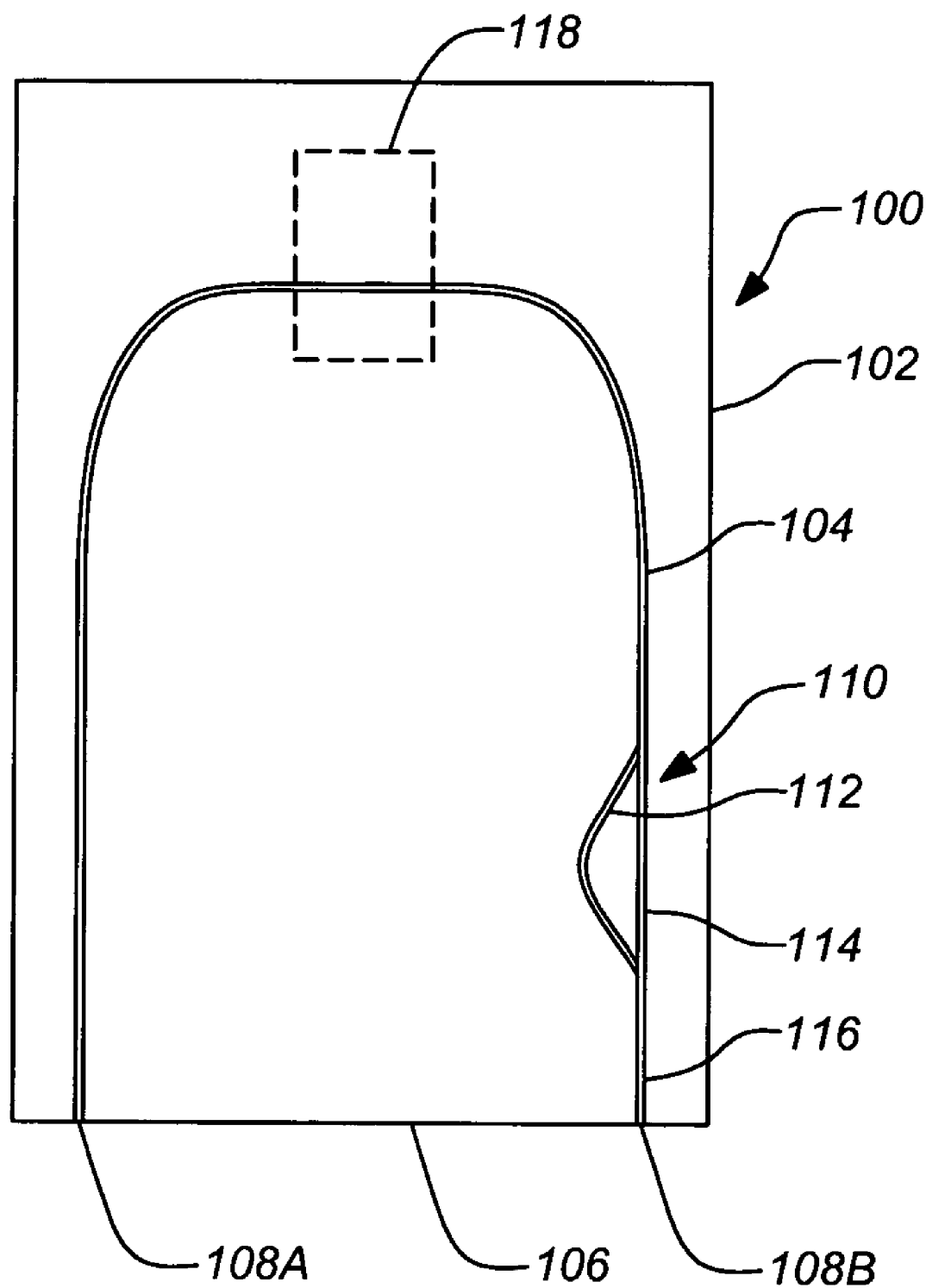
FIG. 1B illustrates a top view of a SRFP optical resonator including a Mach-Zehnder interferometer.

FIG. 1B illustrates the optical resonator 100 with the addition a Mach-Zehnder interferometer (MZI) 110. The addition of the MZI 110 can be used to further enhance the performance and usefulness of the optical resonator 100.

The MZI 110 includes a an upper arm 112 and a lower arm 114 that are used to establish a path length differential for light entering the MZI 110. The remaining waveguide 116 (which can be considered a continuation of the waveguide 104) is used to couple the light to the reflective facet 106 at it's end 108B. Also illustrated is a coupling region 118 which can be used to couple feedback from the resonator 100 to other elements in an optical device. The coupling region 118 can be an evanescent coupling, multi-mode interference waveguide coupler or other suitable coupling known in the art. It should also be noted that the MZI 110 can be positioned on either side of the coupling region 114 in the resonator 100.

To describe intuitively the tunability mechanism one may look at the performance of the unbalanced MZI 110 and the SRFP resonator 100 individually and then in combination. For an ordinary Fabry-Perot cavity in a laser device, lasing is a function of the cavity optical length and typically only occurs near the top of the gain profile of the gain medium. Because adjustment of the cavity optical length is limited, there is no simple technique for tuning over a wide range. In addition, the cavity typically has a relatively broad gain profile, making it possible to have lasing at more than one frequency. In order to select a single frequency for operation, it is necessary to introduce a frequency selective mirror device.

Figure 1C:
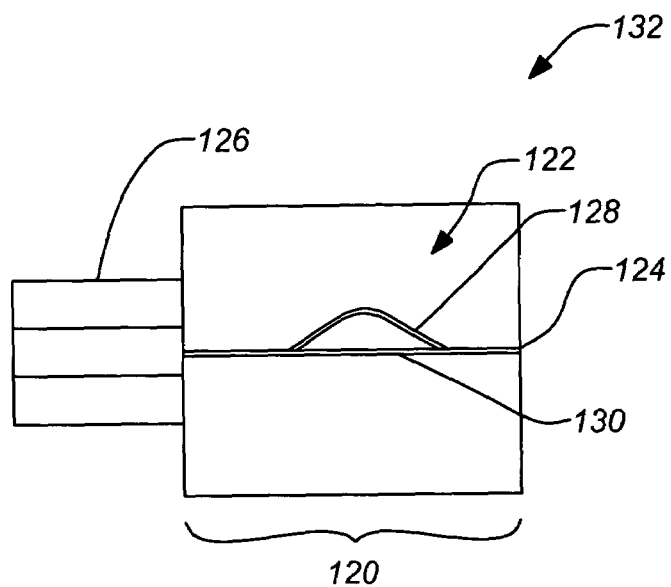
FIG. 1C illustrates a frequency selective mirror device comprising a MZI and a mirror.

FIG. 1C qualitatively illustrates a frequency selective mirror device 120 comprising a MZI 122 and mirror 124, such as a 100% mirrored facet. The MZI 122 alone produces a periodic frequency selectivity to the gain chip 126. Frequency tunability is obtained by changing the difference in optical length between the two arms 128, 130 of the MZI 122, which shifts the mode filtering spectrum of the MZI 122, and consequently changes the lasing mode of the laser 132. The change of the optical length can be induced altering the index of refraction of one or both of the waveguide arms 128, 130 through current injection.

Alternately (or in conjunction with tuning by current injection) tuning may be achieved by changing only the phase of the coupling coefficient. Thus, the resonant frequencies of the device to tune the device. So in order to tune the device, it is not required to change the optical length of the resonator. Tuning of the device can also be obtained by techniques which change the phase of the coupling coefficient.

Figure 1D:
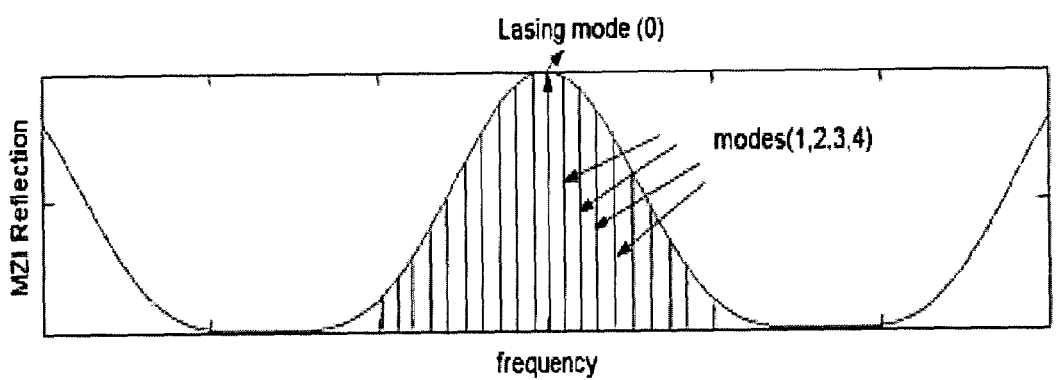
FIG. 1D qualitatively illustrates the reflection output of the frequency selective mirror device using the MZI with respect to frequency.

FIG. 1D qualitatively illustrates the reflection output of the frequency selective mirror device 120 using the MZI 122 with respect to frequency. The cavity modes of the laser 132 are also illustrated. However, the MZI 122 has very low finesse. For a given device length, larger free spectral range (FSR) results in a larger tuning range, but at the expense of the selectivity between the main and the side modes. It should noted that devices similar to the one shown in FIG. 1C do not have high MSR due to the low finesse of the MZI (e.g., as in a known Y-branch laser). The MZ1 122 used alone therefore does not often provide adequate selectivity. To significantly improve performance, an increase in the MSR while maintaining the wide tuning range is necessary. To obtain this, requires a more selective filtering method. The combination of the SRFP resonator 100 with an MZI 110 as shown in FIG. 1B provides the needed selectivity.

Figure 1E:
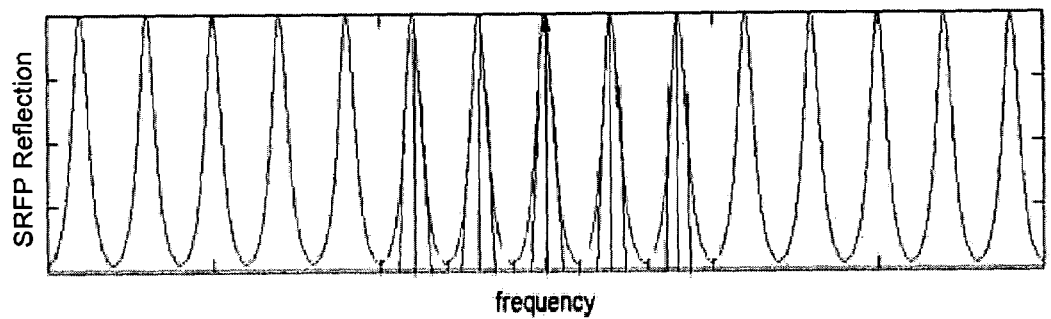
FIG. 1E qualitatively illustrates the reflectance of the SRFP.

FIG. 1E illustrates the reflectance of the SRFP resonator 100. The SRFP is analyzed in detail in the next section. The behavior of the SRFP resonator 100 can be simulated by a Fabry-Perot cavity. However, the SRFP resonator 100 has the advantage over a standard Fabry-Perot cavity resonator due to the use of only single facet 106 reflectivity. This eases the fabrication of the resonator 100 because the length of the SRFP resonator 100 is disassociated from that of the chip. The FSR of the SRFP resonator 100 is not constrained by fabrication requirements, as it is in the case of a standard Fabry-Perot cavity resonator.

The SRFP resonator 100 also possesses advantages over a standard ring resonator through its support of standing waves. This allows the SRFP resonator 100 to use only one coupling region 114 in order to couple light from the SRFP resonator 100 back to a gain medium in an optical device.

Figure 1F:
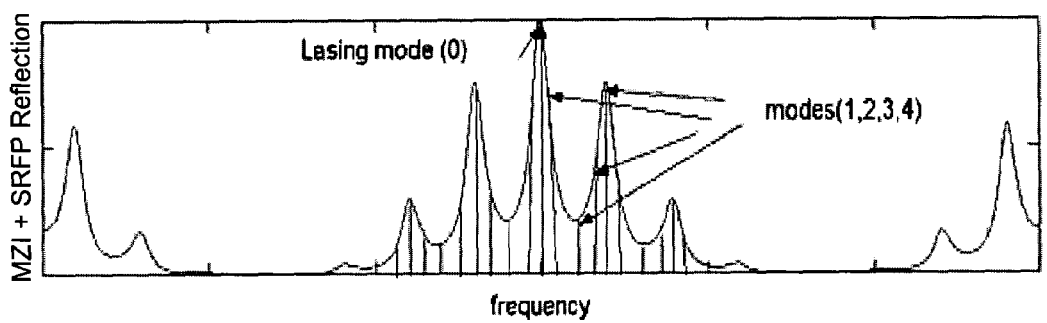
FIG. 1F qualitatively illustrates the combined response of the MZI and a SRFP resonator.

FIG. 1F qualitatively illustrates the combined response of the MZI 110 and the SRFP resonator 100. As shown in FIGS. 1D–1F, the SRFP resonator 100 parameters can be chosen such that the peaks of the SRFP resonator 100 correspond to the peak of the MZI 110 filter, which also corresponds to a cavity mode of the SRFP resonator 100. This main mode, mode 0, will be the lasing mode. Notably, the benefit of the MZI 110 is enhanced by its inclusion within the SRFP resonator 100; conventionally a MZI would be added external to an ordinary Fabry-Perot resonator.

In order to better understand the operation of the SRFP resonator 100 and MZI 110 filter combination, a worst case can be visualized in which each one of the SRFP resonator 100 peaks correspond to a cavity mode (although other cavity modes may also exist at frequencies between the resonator peaks). The SRFP resonator 100 should be designed in a manner to reduce the strength of all the cavity modes between the main mode and the next SRFP resonator peak. The MZI 110 parameters are now selected to ensure that the next SRFP peak becomes the side mode. Referring to FIG. 1E, it should be noted that for the SRFP, if mode 0 is the lasing mode, mode 1 the next cavity mode and mode 4 the cavity mode which is aligned with the next peak of the ring, after adding the MZI filter inside cavity, mode 4 becomes the side mode of the combined device, as shown in FIG. 1F. In the case of the MZI alone, mode 1 is the side mode as shown in FIG. 1D. With this implementation, therefore the MSR is no longer a function of the ratio of mode 0 over mode 1 but it is a function of the ratio of mode 0 over mode 4, making the MSR is a function of the SRFP resonator FSR and MZI gain envelope. The following section presents the theoretical analysis of an exemplary tunable laser supporting the foregoing discussion.

2. Analysis of a Laser Using a Single SRFP Resonator

Figure 2:
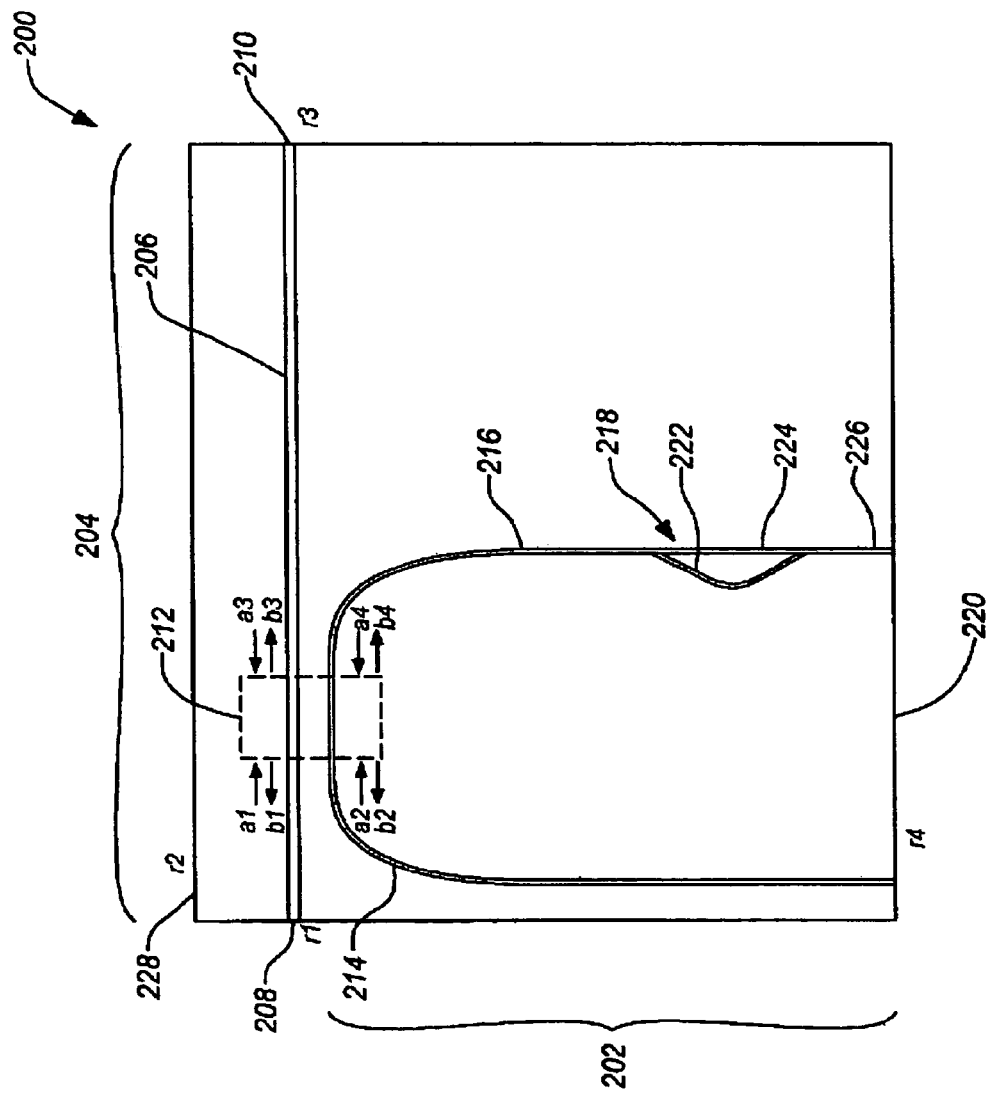
FIG. 2 illustrates a top view of a tunable laser embodiment of the present invention including a tunable element having two waveguides, a MZI and a reflective facet.

FIG. 2 illustrates a top view of a tunable laser embodiment of the present invention including a SFRP tunable element having two waveguides, a MZI and a reflective facet. The tunable laser device 200 comprises a tunable feedback element 202 within a Fabry-Perot cavity 204. The tunable feedback element 202 comprises an optical resonator as described above, a semi-ring Fabry-Perot resonator. The cavity 204 can be defined by the gain (active) medium 206 within a waveguide bounded by reflective facets, a rear facet 208 and a front 210 at opposing ends of the gain medium 206. The front facet 210, bounding the opposing end of the cavity 204, comprises the output of the tunable laser device 200. As is well known in the art the gain medium 206 can include a phase shifter to adjust phase of the laser mode to coincide with a gain peak in order to tune the laser. This fundamentally applies to all laser embodiments presented herein.

The coupling region 212 couples the gain medium 206 and the tunable feedback element 202. In the exemplary embodiment shown, the coupling region 212 is disposed within the gain medium 206 and provides an input and output normalized complex field amplitude from each side of the coupling region 212 to the gain medium 206 toward rear facet 208 on one side and toward front facet 210 on the opposite side. Similarly, the tunable feedback element 202 also receives an input and output normalized complex field amplitude from each side of the coupling region 212 to a first waveguide 214 on one side and to a second waveguide 216 on the opposite side.

In this first exemplary embodiment, the tunable feedback element 202 comprises a Mach-Zehnder interferometer (MZI) 218. The first waveguide 214 of the tunable feedback element 202 provides a path from the coupling region 212 to a high reflection rear facet 220 of the passive medium. The second waveguide 216 of the tunable feedback element 202 provides a path from the coupling region to a first end the MZI 218. The MZI 218 includes a an upper arm 222 and a lower arm 224 that are used to establish a path length differential for light entering the MZI 218. The opposite end of the MZI 218 is coupled to a third waveguide 226 that provides a path from the MZI 218 to the high reflection rear facet 220 of the passive medium. It should be noted that the two waveguides of the described embodiment refer to the first waveguide 214 on one side of the coupling region 212 and the combination of the second and third waveguides 214, 226 that are interrupted by the MZI 218 on opposite of the coupling region 212. Alternately, the tunable feedback element 202 can be structured with the MZI 218 positioned on the first waveguide 214 and the second waveguide 214 coupled directly to the rear facet 220.

It should be noted that facets 208, 210 and 220 are generally formed from each entire respective surface of the device 200. This greatly simplifies the manufacturing process. Thus, rear facet 220 of the passive medium can be formed from the edge surface of the device 200 adjacent to both the surfaces of rear facet 208 of the active medium and front facet 210 of the active medium of the cavity 204. Similarly, the front facet 228 of the passive medium can be formed from the entire edge surface opposite the rear facet 220.

The coupling region 212 between the gain medium 206 and the tunable feedback element 202 can be modeled as follows using a similar approach as in A. Yariv, "Universal relations for coupling of optical power between micro resonators and dielectric waveguides", Electronics Letters, vol. 36, page 321, 2000, which is incorporated by reference herein, the gain-tunable element coupling region 212 as shown in FIG. 2, where $a_i$ and $b_i$ are the input and output, respectively, normalized complex field amplitudes entering and leaving the coupling region 212. Under the condition of lossless coupling, that is, $$|K_i(f)|^2 + |t_i(f)|^2 = 1 \tag{1}$$

The complex field amplitudes satisfies the following set of equations, $$b_1 = 0a_1 + 0a_2 + t_1(f)a_3 + K_1(f)a_4$$

$$b_2 = 0a_1 + 0a_2 - K_1(f)^*a_3 + t_1(f)^*a_4$$

$$b_3 = t_2(f)a_1 + K_2(f)a_2 + 0a_3 + 0a_4$$

$$b_4 = -K_2(f)^*a_1 + t_2(f)^*a_2 + 0a_3 + 0a_4 \tag{2}$$

where f is the frequency of the field, $t_1(f)$, $t_2(f)$ and $K_1(f)$, $K_2(f)$ are the transmission and coupling coefficients of the complex field region, respectively. The set of equations (2) can be also written in the matrix form, $$\begin{pmatrix} b_1 \\ b_2 \\ b_3 \\ b_4 \end{pmatrix} = \begin{pmatrix} 0 & 0 & t_1(f) & K_1(f) \\ 0 & 0 & -K_1(f)^* & t_1(f)^* \\ t_2(f) & K_2(f) & 0 & 0 \\ -K_2(f)^* & t_2(f)^* & 0 & 0 \end{pmatrix} \begin{pmatrix} a_1 \\ a_2 \\ a_3 \\ a_4 \end{pmatrix} \tag{3}$$

The tunable feedback element 202 shown in FIG. 2 can be analyzed as follows. In the structure of FIG. 2, $$\frac{a_4}{b_4} = R_4 = A\cos^2\left(\frac{\pi}{c}f(n_u L_u - n_l L_l)\right)(-r_4) \tag{4}$$

where $$A = e^{-\left(2\alpha_a n_a L_a + 2\alpha_b n_b L_b + 2\alpha_c n_c L_c + j\frac{2\pi f}{c}(2n_a L_a + 2n_b L_b + n_u L_u + n_l L_l)\right)} \tag{5}$$

$$a_2 = (-r_4)e^{-(2n_c \alpha_c L_c)} e^{-j\frac{2\pi f}{c}(2n_c L_c)} b_2$$

where $\alpha_a$, $n_a$ and $L_a$ are respectively, the loss per unit length, the refractive index and the length of the waveguide 216 and $\alpha_b$, $n_b$ and $L_b$ are the corresponding quantities for the waveguide 224. $n_u$ and $L_u$ are respectively the refractive index and the length of the upper arm 220 of the MZI 218 and $n_l$ and $L_l$ are the respective corresponding quantities for the lower arm 222 of the MZI 118. $r_2$ and $r_4$ are the field reflectivities of the front facet 226 and rear facet 220, respectively, of the passive medium and $r_1$ and $r_3$ are the field reflectivities of rear facet 208 and front facet 210, respectively, of the active medium.

From equations (3), (4) and (5), one can determine, $$\frac{b_3}{a_3} = t_2(f)R_1[t_1(f) + K_1(f)R_{a_4 a_3}] + K_2(f)R_2[-K_1(f) + t_1(f)^* R_{a_4 a_3}] \tag{6}$$

where, $$R_1 = -r_1, \tag{7}$$

$$R_{a_4 a_3} = -\frac{R_4(K_2(f)R_1 t_1(f) + t_2^* R_2 K_1)}{[1 - R_4(t_2(f)^* R_2 t_1(f)^* - K_2(f)R_1 K_1(f))]}, \tag{8}$$

$$R_4 = A\cos^2\left(\frac{\pi}{c}f(n_u L_u - n_l L_l)\right)(-r_4), \tag{9}$$

$$A = e^{-\left(2n_a \alpha_a L_a + 2n_b \alpha_a L_b + 2n_c \alpha_c L_c + j\frac{2f\pi}{c}(2n_a L_a + 2n_b L_b + 2n_c L_c + n_u L_u + n_l L_l)\right)}. \tag{10}$$

In the case of a tunable laser for WDM applications, one can neglect the frequency dependence of the coupling region over the working frequency range to obtain a rough approximation. Accordingly, it follows that, $$K_i = |K_i|e^{j\Phi_{ki}}, \quad t_i = |t_i|e^{j\Phi_{ti}} \tag{11}$$

$f_1$, the "resonant frequency" of the tunable element has to satisfy equation (11), which implies, $$\cos^2\left(\frac{\pi}{c}f_1(n_u L_u - n_l L_l)\right) = 1, \tag{12}$$

$$e^{-j(D+E+F)} = 1, \tag{13}$$

where, $$D = -\Phi_{t_1} - \Phi_{t_2}, \tag{14}$$

$$E = \frac{2\pi f_1}{c}(n_u L_u + n_l L_l) + \frac{2\pi f_1}{c}(2n_G L_G), \tag{15}$$

$$F = \frac{2\pi f_1}{c}(n_c L_c) + \frac{2\pi f_1}{c}(2n_b L_b) \tag{16}$$

If $\Delta f$ is defined through the relation, $$f = f_1 + f - f_1 = f_1 + \Delta f, \tag{17}$$

the following result is obtained, $$\frac{b_3}{a_3} = K_2(-K_2^*)r_2\left[1 + \frac{GH}{1-GH}\right], \tag{18}$$

where, $$G = e^{-\left(2\alpha_G L_G + 2\alpha_b L_b + 2\alpha_c L_c + j\frac{2\Delta f\pi}{c}(2n_G L_G + 2n_b L_b + 2n_c L_c + n_u L_u + n_l L_l)\right)} \tag{19}$$

$$H = |t_1||t_2|r_4\cos\left(\frac{\pi\Delta f}{c}(n_u L_u - n_l L_l)\right)^2 \tag{20}$$

A study of the foregoing analysis can show that the presence of an imperfect high reflection facet ($r_4 \ne 1$) does not significantly deteriorate the resonator 202 response. In addition, the effect of a back reflection ($r_1 \ne 0$) is to improve the performance of the resonator in terms of reflection ($b_3/a_3$) and free spectral range (the spacing between two consecutive peaks of the same intensity). Thus, the free spectral range can be increased by changing the back reflection, $r_1$, rather than the resonator optical length. Also, even if there is a reflection returning to the gain medium 206 directly from the coupling region 212, the device 200 will operate properly up to the moment where this reflection is equal to the reflection ($b_3/a_3$) returning from the resonator 202.

3. Engineering a Single SRFP Laser

A general analysis of a single tunable frequency mirror (a semi-ring Fabry-Perot resonator) is presented above. This section is concerned with the engineering of the tunable frequency mirror together with the gain section in order to produce a widely tunable single-mode laser as described in FIG. 2. Although embodiments of the invention can be constructed as hybrid devices with distinct elements separately fabricated and integrated together, the invention can advantageously be used to form optical devices through monolithic fabrication, in a simpler, cost effective manner.

One can examine a specific design in which the active medium is a III-V material system operating at approximately 1.55 µm wavelength. For this specific exemplary numerical application, a MZI free spectral range (FSR) of approximately 1,248 Ghz (equivalent to a tunability range of approximately 1,248 Ghz (10 µm)) is chosen. A fine wavelength selection of approximately 50 Ghz is considered. This is the frequency difference between two consecutive frequencies of the laser channels and, in turn, corresponds to the total combined length of waveguide 114, waveguide 116 and waveguide 124 of approximately 1 mm.

It can also be assumed that the gain medium is substantially removed from the tunable filter so that the waveguide loss reaches a maximum value of approximately 10 dB/cm, $r_1$, $r_2$ and $r_3$ are substantially equal and equal to approximately 0.97, and $K_1$ and $K_2$ are substantially equal and equal to 0.7. The main reflection of the tunable filter is taken to correspond to a cavity mode, which is the laser mode. The 10 dB/cm loss is applied as a worst cast estimate for evaluation purposes; realistic losses are significantly lower in many applications, depending upon manufacturing and other considerations.

Referring to FIG. 2, it is also assumed that the separation of the cavity modes is such that the reflection of the adjacent cavity mode from the tunable filter element 202 is lower than that of the cavity mode, coinciding with the next strongest reflection peak of the tunable filter element 202. In the calculation of the MSR, a worst scenario is assumed in which both the strongest and next strongest field reflection peak spectrum of the tunable filter element 202 correspond to a cavity mode. The contribution of the filter reflection to the energy stored in each mode only is included in order to calculate the single contribution of the tunable filter element 202 in the MSR. This means that these calculations represent a pessimistic view where the same gain is present both for the main and side mode. In reality, this is not truly the case and the gain is relatively flat for the side mode.

Figure 3A:
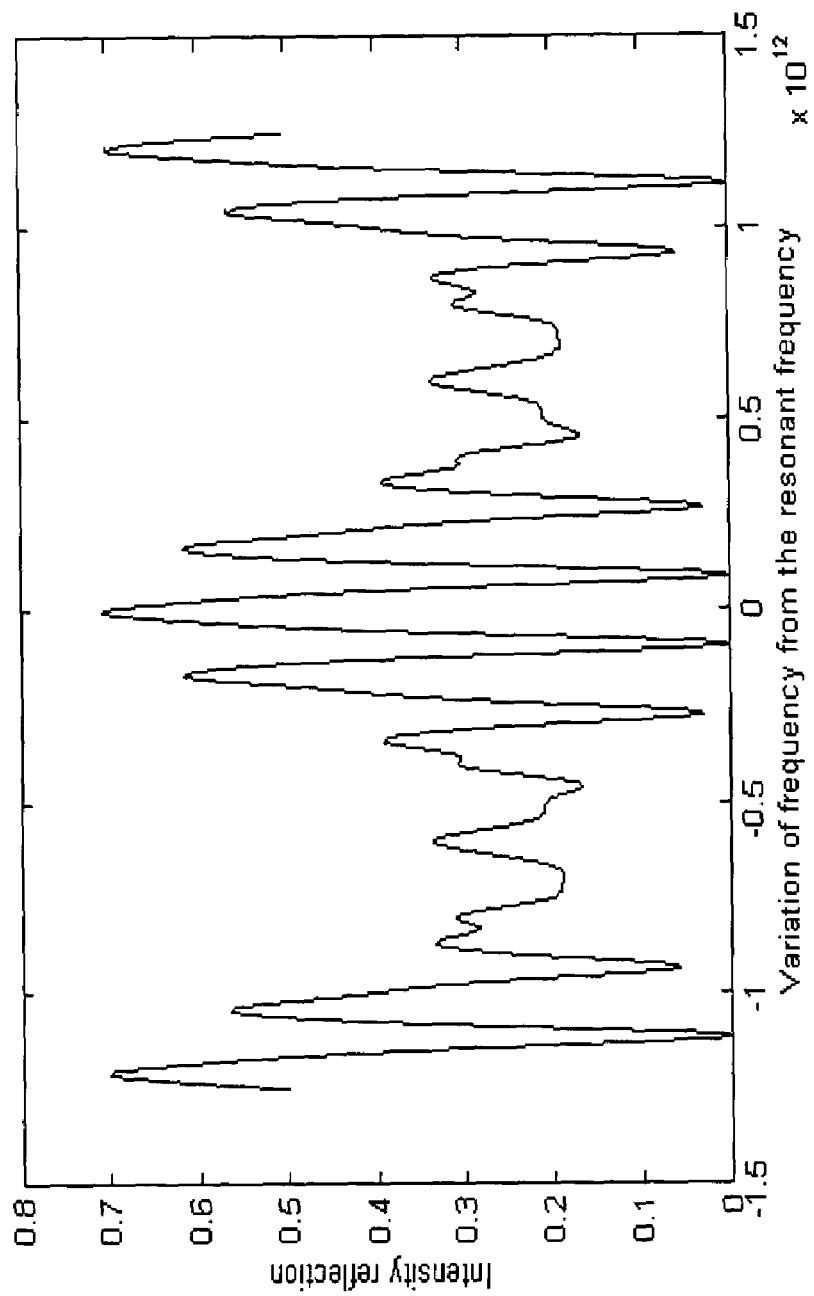
FIG. 3A illustrates the intensity coming back from the tunable frequency element versus frequency of the exemplary embodiment of FIG. 2.

FIG. 3A illustrates the intensity coming back from the tunable frequency element versus frequency of the exemplary embodiment of FIG. 2. A fine wavelength selection FSR of approximately 50 Ghz and a MZI FSR of approximately 1,248 Ghz are applied. In addition, an intensity coupling between the gain-tunable element of approximately 0.49 and a waveguide loss of approximately 10 dB/cm are also used.

The considered gain medium parameters of the exemplary embodiment of FIG. 2 are approximately 0.2 µm thickness, 3 µm width, 300 µm length and a material loss of approximately 80/cm. The gain versus carrier density characteristic of the active medium is associated with a transparency carrier of approximately $5\times10^{-16}$ cm$^3$.

According to L. Coldren et al., "Diode Lasers and Photonic Integrated Circuits", p. 45, 1995, which is incorporated by reference herein, the threshold current is given by, $$I_{th} \approx \frac{qVBN_{tr}^2}{\eta_i}e^{2(\langle\alpha_i\rangle + \alpha_m)/\Gamma g_0}, \tag{21}$$

where V is the volume of the device, $\eta_i$, the quantum efficiency (in our case its value is approximately 0.7), $N_{tr}$ is the transparent coefficient of approximately $2\times10^{18}$ cm$^{-3}$, $\alpha_i$ is the gain medium intrinsic loss, (approximately 80 cm$^{-1}$), B the bimolecular recombination coefficient (usually B~10$^{-10}$ cm$^3$/s for most III–V materials of interest). A passive waveguide loss of approximately 10 dB/cm, a confinement factor $\Gamma$ of approximately 0.7 and a differential gain $g_0$ of approximately $5\times10^{-16}$ cm$^2$ are also applied. The mirror loss $\alpha_m$ is given by the following $$\alpha_m = \frac{1}{L_{activemedium}} \ln\left(\frac{1}{r_3 r}\right), \quad (22)$$

where, $$r_3 = \left|\frac{b_3}{a_3}\right|. \quad (23)$$

$r_3$ is the reflectivity from the strongest peak of the tunable frequency mirror, r=0.3922 is the output facet field reflectivity of the tunable laser 100.

Figure 3B:
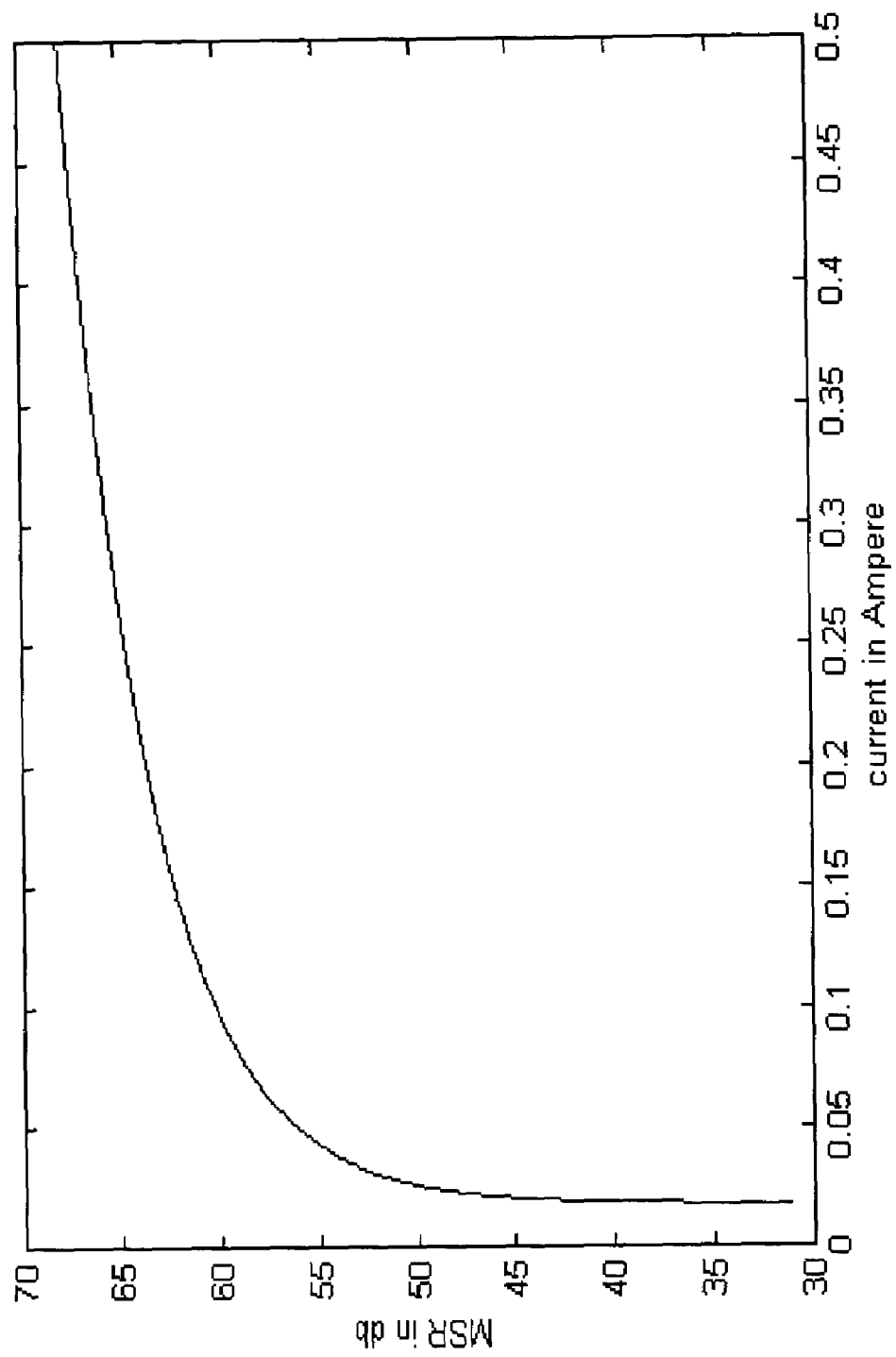
FIG. 3B is a plot of the Mode Suppression Ration (MSR) versus the current in Amperes for the exemplary embodiment of FIG. 1B.

FIG. 3B is a plot of the Mode Suppression Ration (MSR) versus the current in Amperes for the exemplary embodiment of FIG. 1B. According to L. Coldren et al., p. 107, Ibid., the Mode Suppression Ratio (MSR) can be given by, $$MSR(\text{dB}) \approx 10 \log_{10}\left[\frac{\Delta\alpha + \Delta g}{\partial G} + 1\right], \quad (24)$$

where $\partial G$ is the separation between the mirror loss and the net modal gain for the main mode and is given by, $$\partial G \approx \frac{10^{-3} I_{th}}{I - I_{th}} \text{ cm}^{-1}. \quad (25)$$

$\Delta\alpha$=91.4 m$^{-1}$ is the loss margin and $\Delta g$=0 is the modal gain margin. Proceeding in this way, $I_{th}$=20.2 mA.

Figure 3C:
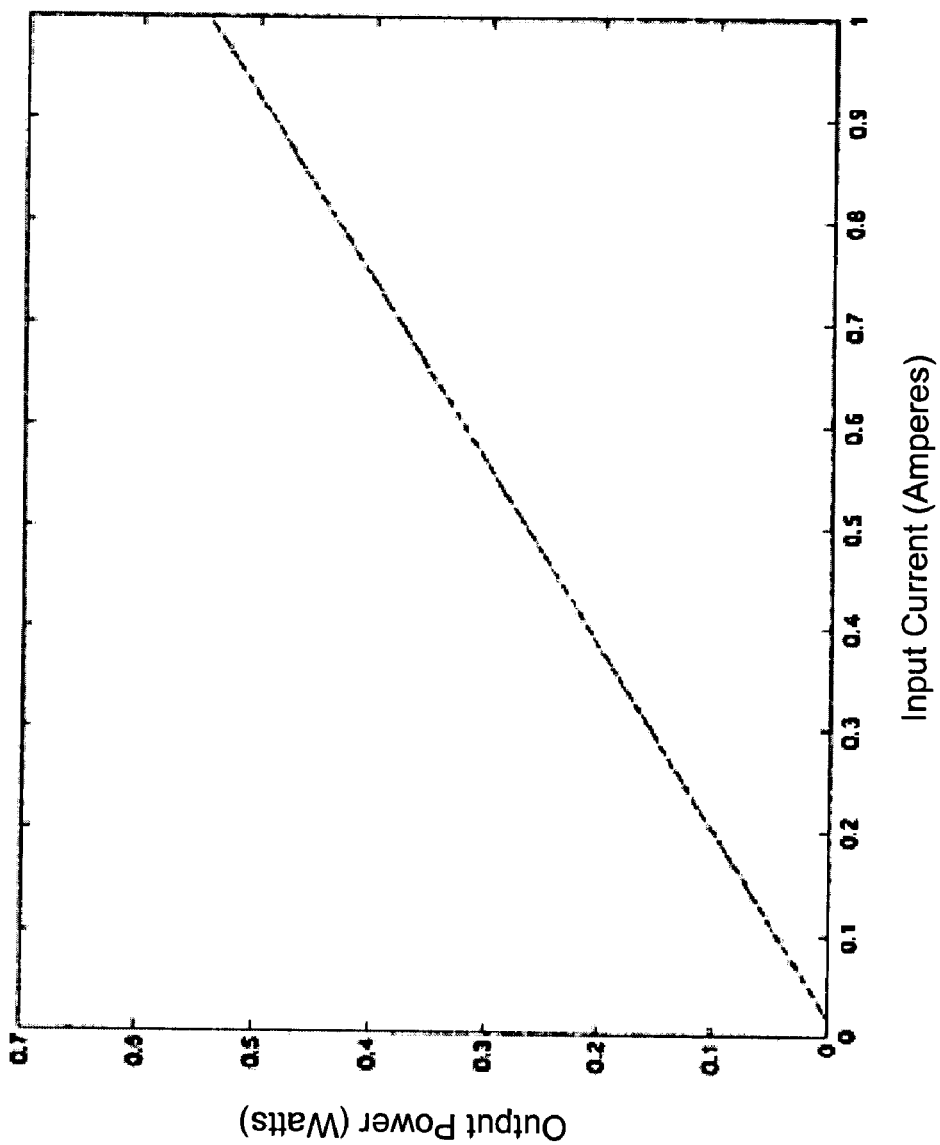
FIG. 3C is a plot of the output power in Watts versus the input current in Amperes for the exemplary embodiment of FIG. 1A.

FIG. 3C is a plot of the output power in Watts versus the input current in Amperes for the exemplary embodiment of FIG. 1A. The output power is given by L. Coldren et al., p. 42, Ibid.

$$P_0 = \eta_i \left(\frac{\alpha_m}{\langle\alpha_i\rangle + \alpha_m}\right) \frac{h\nu}{q} (I - I_{th}) \text{ for } I > I_{th}. \quad (26)$$

where h is Planck's constant.

4. Laser Embodiments Without an SRFP Resonator and Minimized Coupling Among Elements The present invention is directed to other laser embodiments. Those skilled in the art can apply the analytic framework in section 2 respecting a SRFP resonator to render a similar analysis for a first laser embodiment using a single ring resonator and a second laser embodiment using two MZIs. Both embodiments require only minimal coupling between elements, simplifying manufacturing when compared without prior laser designs.

4.1 A Single Ring Resonator Laser

FIG. 4A illustrates an exemplary embodiment of a laser 400 including a single ring resonator 410. The semiconductor laser 400 can be monolithically fabricated. The laser 400 comprises two regions, a gain medium 406 and one passive ring resonator 410. The laser 400 also includes two reflective facets 402, 404, one at each end of the gain medium 406. Light is produce from the front face 404. Importantly, the laser 400 uses only a single coupling region 408 between the gain medium 406 and the ring resonator 410.

The laser 400 has the advantage that it readily lends itself to planar fabrication and does not require any grating structure or moving parts. The gain medium 406 provides light amplification and the ring resonator 410 in combination with a back reflection from the rear facet 402 exhibits a substantially uniform peak reflection at all resonant frequencies. The free spectral range (FSR) is related to the optical length of the ring resonator 410.

The laser 400 can be tuned by shifting the resonant frequencies of the ring resonator 410. Particularly, tuning of the laser 400 can be obtained by changing the combination of the resonant frequencies resulting from the ring resonator 410 and the back reflection from the rear facet 402. Alternately, this shift can be obtained, for example, by changing the optical length (circumference) of the ring resonator 410 or by changing the phase of the coupling coefficient of the coupling region 408 between the gain medium 406 and the ring resonator 410.

Figure 7:
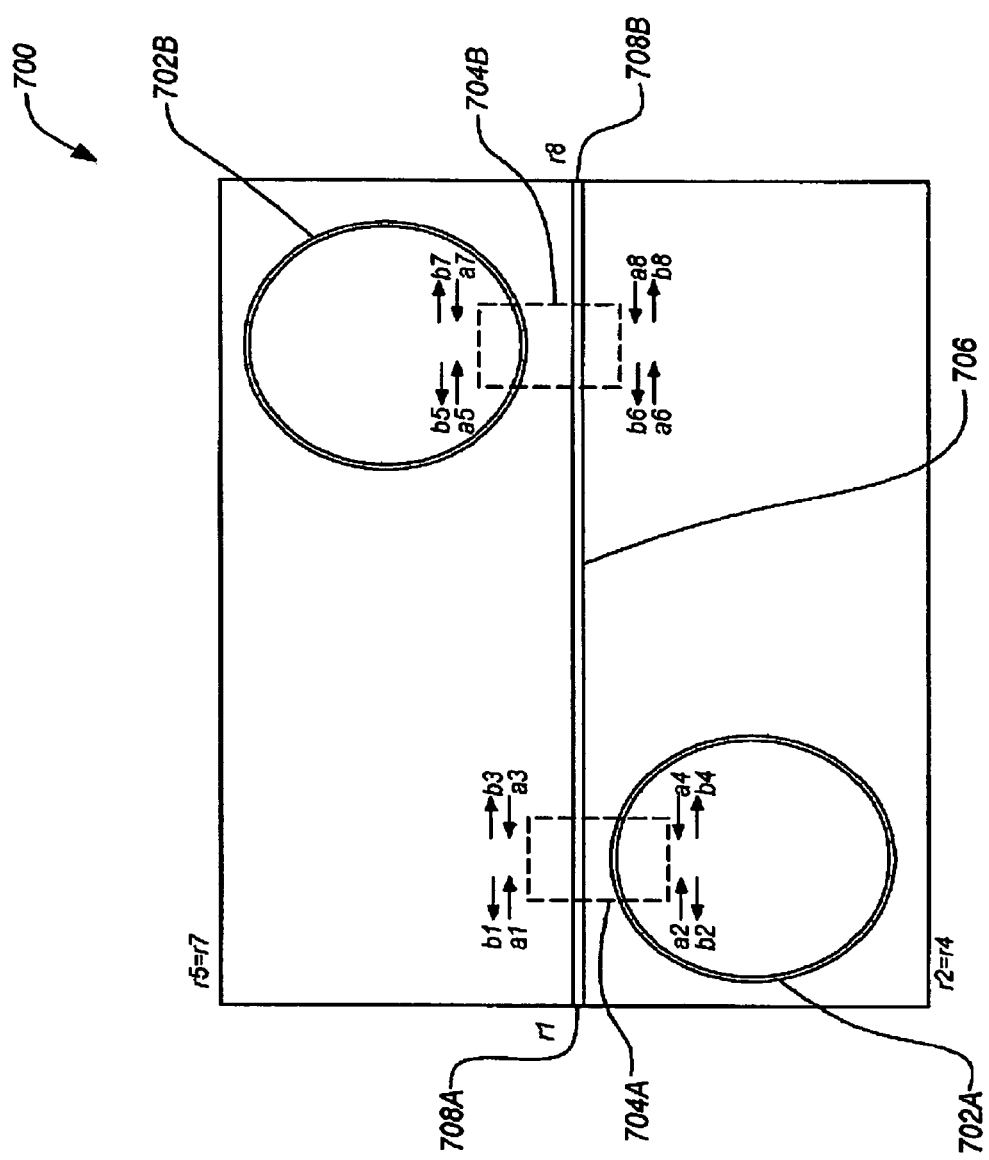
FIG. 7 illustrates a laser including two ring resonators on opposing sides of a length of gain medium.

Tuning of some implementations of the laser 400 may not be as wide as the laser of FIG. 7, discussed hereafter. However, this laser 400 exhibits improved mode suppression ratio (MSR) and stability over other conventional designs.

4.2 A Double Ring Resonator Laser

Figure 4B:
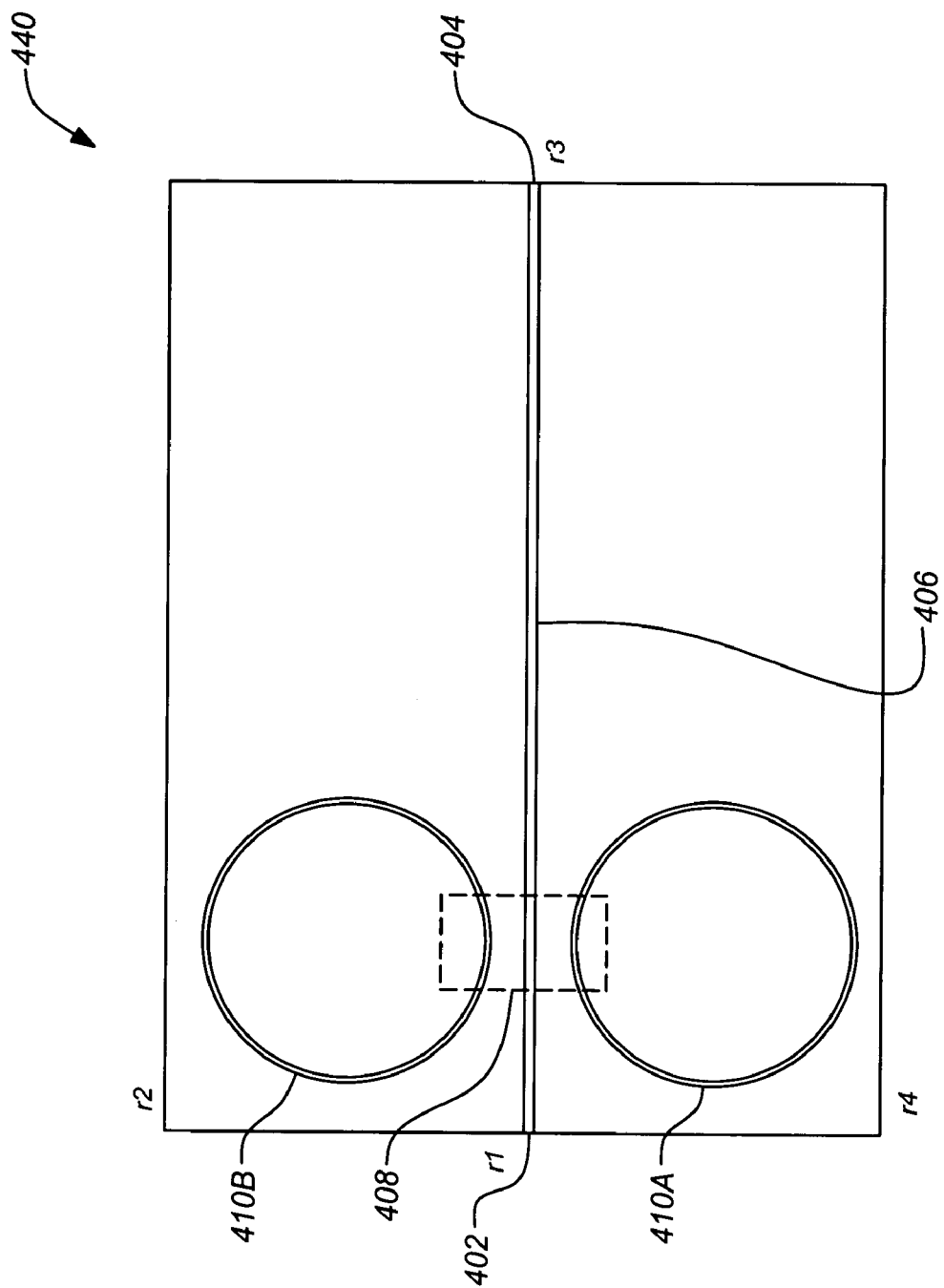
FIG. 4B illustrates an exemplary embodiment including a pair of ring resonators.

FIG. 4B illustrates an exemplary embodiment of a laser 440 including a pair of ring resonator 410A and 410B. The laser 440 comprises a gain medium 406 and two passive ring resonators 410A and 410B. The laser 400 also includes two reflective facets 402, 404, one at each end of the gain medium 406. Light is produce from the front face 404. This laser 440 operates similar to the laser 400 described above, however two ring resonator responses are now combined with the back reflection from the rear facet 402 to produce the reflection. As above, the semiconductor laser 440 can be monolithically fabricated. Importantly, the laser 400 uses only a single coupling region 408 between the gain medium 406 and both ring resonators 410A and 410B.

The coupling region 408 couples light from the gain medium 406 to the ring resonators 410A, 410B and the gain medium 406 and from one ring resonator, e.g. 410A, to the other resonator, e.g. 410B, and the gain medium 406. For example, the coupling region 408 can be a 3*3 MMI coupler.

4.3 A Laser Using Two Mach-Zehnder Interferometers

Figure 4C:
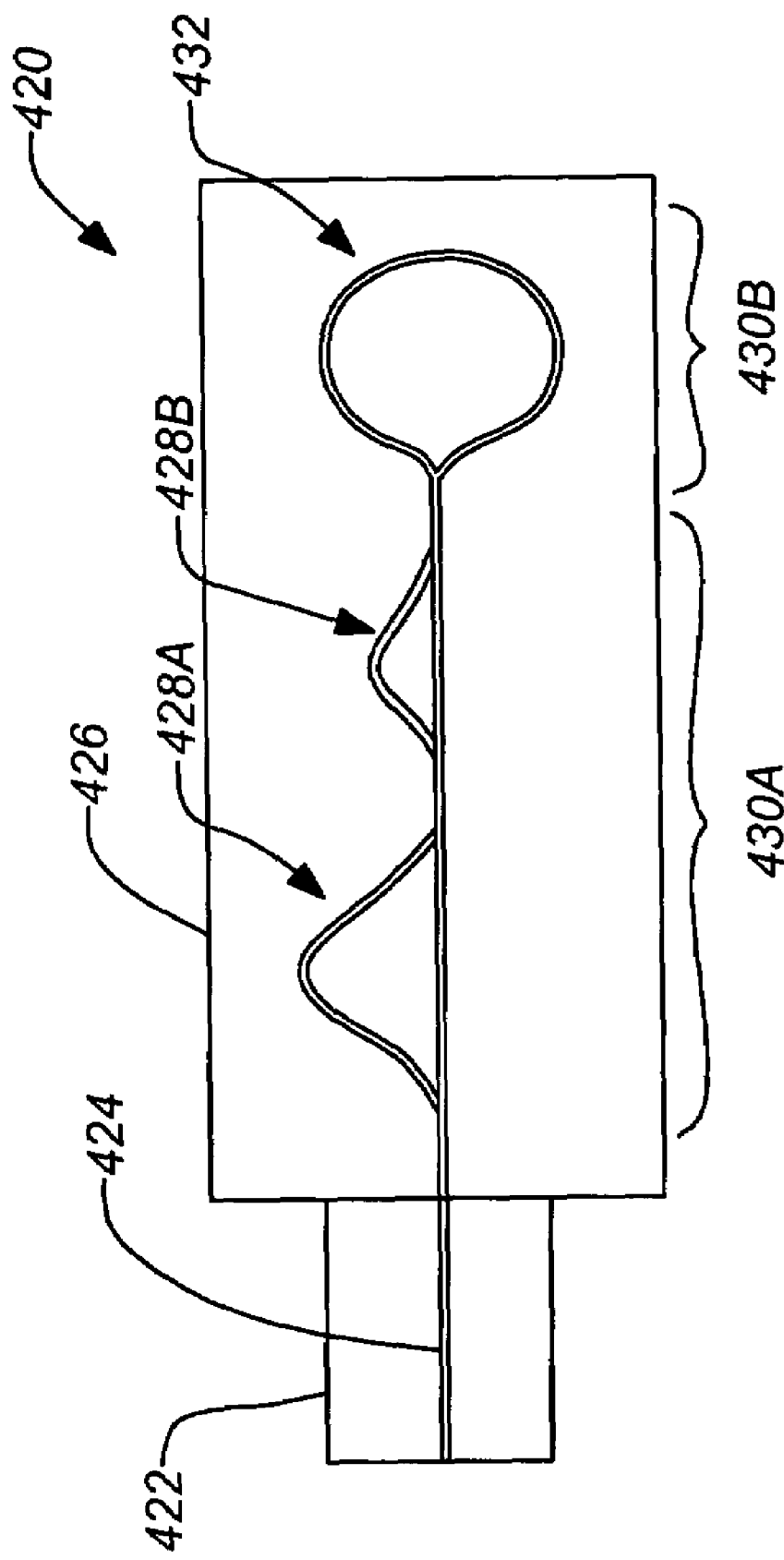
FIG. 4C illustrates an exemplary embodiment of a laser including two MZIs.

FIG. 4C illustrates an exemplary embodiment of a tunable semiconductor laser 420 including two MZIs 428A, 428B. The tunable laser 420 comprises a combination of a gain medium 424 and two reflector elements 430A, 430B. The gain medium 424 can be implemented within a separate gain chip 422 and coupled to the semiconductor medium 426 of two reflector elements 430A, 430B. The first reflector element 430A can be described as a tunable filter element. The tunable reflector element 430A can comprise the combination of at least two MZIs 428A, 428B in series. The MZIs 428A, 428B have different free spectral ranges, i.e. one has a larger free spectral range than the other, and operate as described above. As shown in FIG. 4C, the first MZI 428A has a larger free spectral range than the second MZI 428B. In alternate embodiments, the second MZI 428B can have a larger free spectral range than the first MZI 428A.

Frequency tunability of the device can be obtained by changing the difference of optical path length of the MZI 428A with the larger free spectral range. The MZI with a large free spectral range selects a particular wavelength region within the gain bandwidth, but this interferometer does not provide sufficient discrimination between neighboring cavity modes. The MZI 428B with smaller free spectral range then selects a particular cavity mode within the wavelength region selected by the MZI 428A with larger free spectral range. Lasing light is thus produced from the left side of the gain chip 422 as shown in FIG. 4C. The MZI 428B with the smaller free spectral range also defines the finesse of the reflector element 430.

The second reflector element 430B of the laser 420 can comprise a loop 432 which receives light from the first reflector element 430A and returns it to the first reflector element 430A. Alternately, the second reflector element 430B can be a cleaved facet of the semiconductor medium 426 (not shown, but see FIG. 1C). However, if the tunable element is fabricated in an amorphous medium, e.g. silicon, it can be difficult to cleave the facet at the end of the first reflector element 430A that will perform as a high quality reflector. Accordingly, the loop 432 used at the end of the second MZI 428B can preferably serve as a reflector for implementations where the tunable element is fabricated in an amorphous silicon technology.

This laser 420 can be produced using simple planar fabrication technology, and does not require any grating structure or moving parts. The tunable element can be easily fabricated in a silicon technology. In contrast with other conventional designs, the laser 420 minimizes the required coupling region in the whole structure. For example, one known design uses a MZI in series with a ring resonator which employs a coupling region between the waveguide and the ring resonator and also between the ring and the waveguide in addition to a coupling region between the gain and the passive medium. Indeed, the only coupling used in the laser 420 is between the gain medium 424 on the gain chip 422 and the semiconductor (passive) medium 426 including the tunable filter.

The laser 420 has the advantage of easy fabrication of the tunable filter only using photolithography technology for a silicon medium. In addition, the device exhibits an improved mode suppression ratio over comparable lasers.

5. Resonators on Opposite Sides of a Gain Medium

Further Embodiments of the invention include laser structures employing a pair optical resonators, each resonator on opposite sides of a gain medium.

Figure 5A:
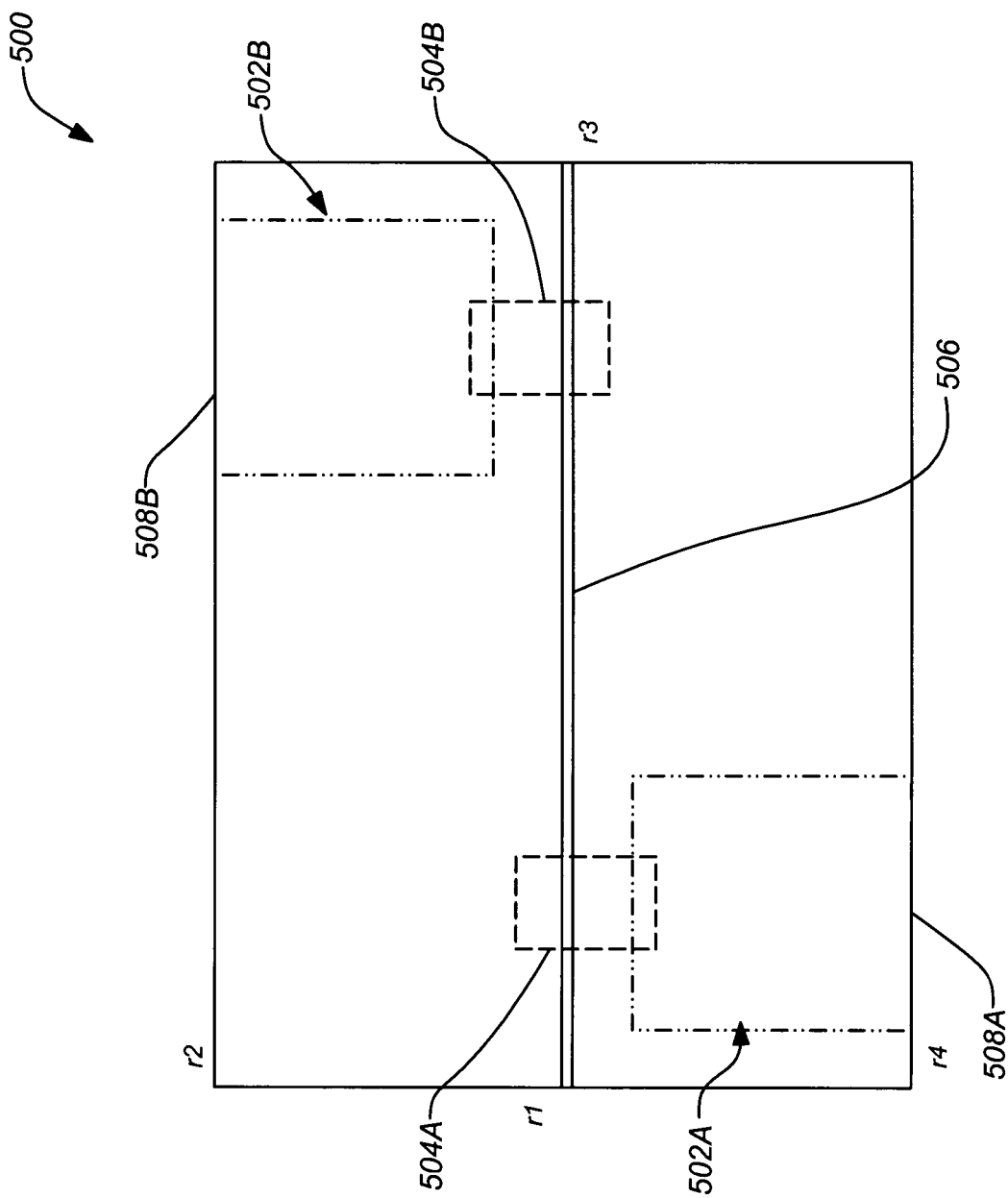
FIG. 5A illustrates a class of laser including two optical resonators on opposing sides of a length of gain medium.

FIG. 5A illustrates a class of laser 500 including two optical resonators 502A, 502B on opposing sides of a length of gain medium 506, i.e. the towards the left and right ends of the gain medium 506. Previous lasers have employed a gain medium bounded by optical resonators such as gratings. The present invention discloses two novel semiconductor lasers using a resonator pair bounding a gain medium 506. The lasers use the Vernier effect for the tunability.

FIG. 5B illustrates the Vernier effect. The reflection spectra 510A the first resonator 502A is shown over the reflection spectra 510B for the second resonator 502B. The lasing mode 512 is the one that is a mode of both resonators 502A, 502B. Large tunability of the laser 500 can be obtained by shifting the resonator modes of at least one of the two resonators 602A, 602B to align with another mode of the other resonator 602B, 602A.

In addition, in further embodiments of the invention, the optical resonators 602A, 602B can be disposed on opposing sides of a width of gain medium 606. In the case of SRFP resonators, which employ side facets 608A, 608B, this allows separate adjustment and design of each resonator 602A, 602B.

As discussed above, further embodiments of the invention include a new type of tunable semiconductor laser using an optical resonator on each side of a gain medium. At least one of the optical resonators comprises a SRFP resonator as previously described. The tunable laser can be visualized as the combination of a gain medium bounded two reflectors, i.e., the resonators. One of the reflectors can be envisioned as a tunable filter element. As before, the nature of the coupling between the gain medium and the two resonators is not critical for the study of the device. For example, the nature of the coupling region can be evanescent coupling or multi mode couplers etc.

5.1 A Laser Using SRFP Resonators on Opposite Sides of the Gain Medium

Figure 6A:
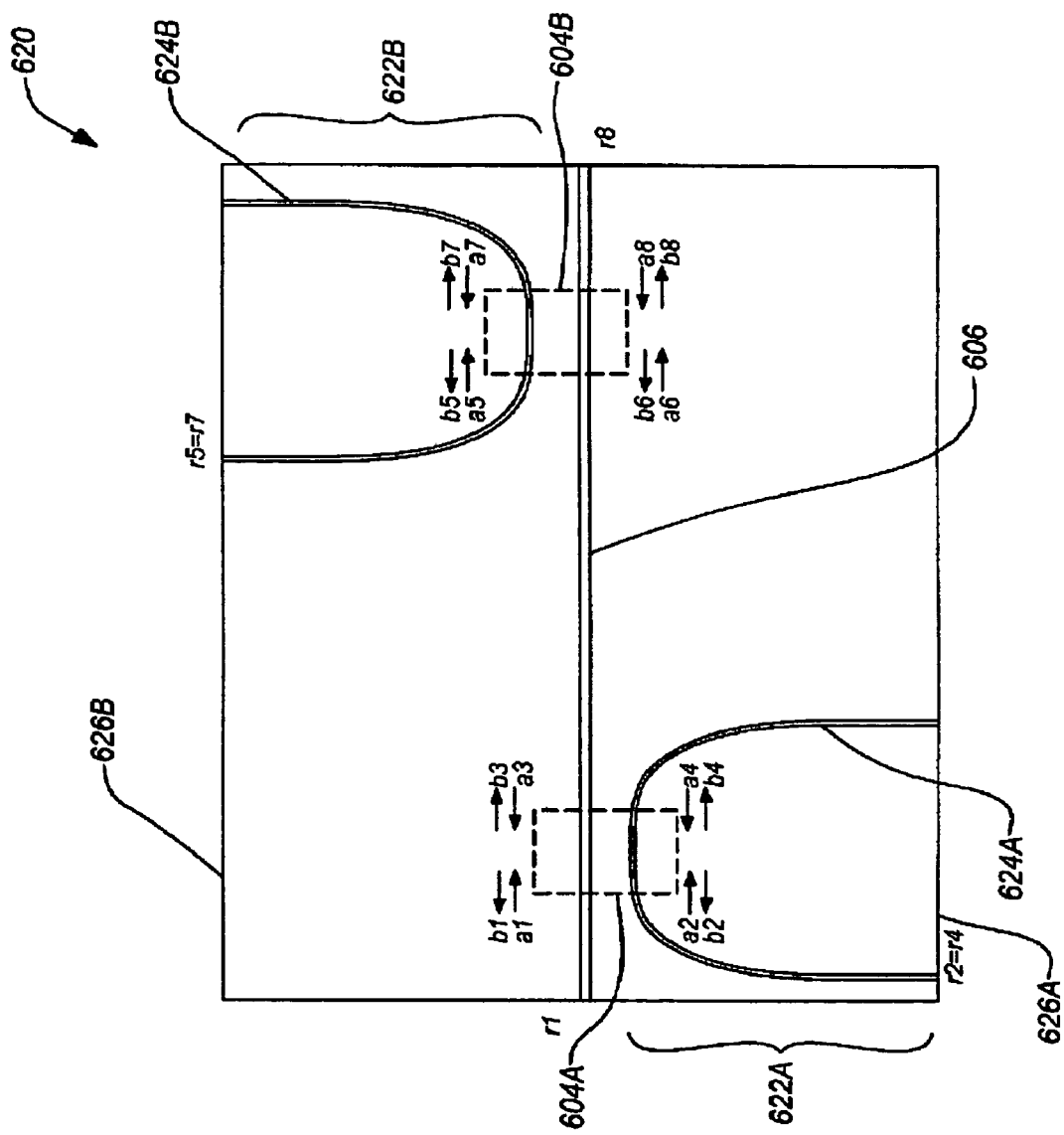
FIG. 6A illustrates a laser including two SRFP optical resonators on opposing sides of a gain medium.

FIG. 6A illustrates a top view of an exemplary laser embodiment 620 of FIG. 5A where both resonators comprise SRFP resonators 622A, 622B. The resonant frequencies of the laser 620 are those that correspond both to the resonant frequencies of the two SRFP resonators 622A, 622B and to a cavity mode of the gain medium 606. The frequency tunability of the laser 620 is obtained by changing the difference of optical path length of one of the SFRP resonators 622A, 622B to employ a Vernier effect as described above.

Figure 6B:
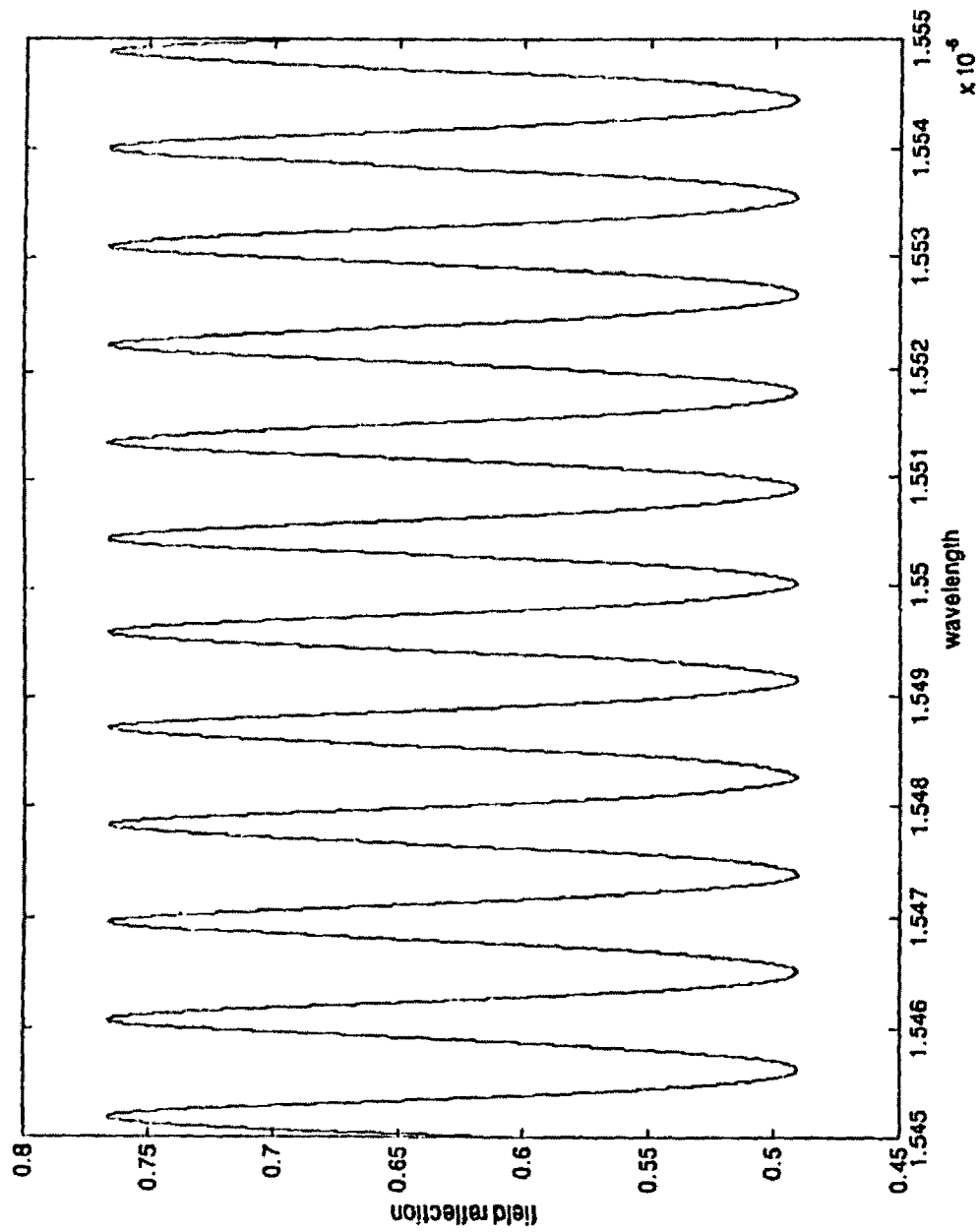
FIGS. 6B–6E are exemplary plots of the spectra of the light reflected from the resonator for different values of back reflection coefficients and high facet reflections.

As with the underlying SFRP resonators 622A, 622B, a laser 620 according to the embodiment of FIG. 6B employs relatively simple fabrication technology and does not require any grating structure or moving parts. When compared with a known double ring resonator coupled laser (DR-RCL), the waveguides 624A, 624B of the SFRP resonators 622A, 622B obtain lower curvature. See e.g., Bin Liu, Ali Shakouri, E. Bowers "Wide Tunable Double Ring Resonator Coupled Lasers", IEEE Photonics Technology Letters, Vol. 14, No. 5, May 2002 which is incorporated by reference herein. This not only better facilitates fabrication but also reduces the losses related to the bending of the waveguides 624A, 624B. Also, because the FSR of resonators in general is inversely proportional to the length of the cavity, if a high FSR resonator is desired, the length of the resonator should be decreased. In the case of ring resonators, the minimum affordable length of the resonator will be substantially determined by the waveguide's bending loss. Because the waveguide's bending is lower in the present SFRP resonators 622A, 622B than in ring resonators, a higher resonator FSR should be obtainable with the laser 620 shown in FIG. 6B.

The laser 620 comprises three main regions, a gain medium 606 and two passive SRFP resonators 622A, 622B. There are different techniques for coupling the gain medium to the SRFP resonators as previously discussed. However, the nature of the coupling is not critical for the analytical study of the laser 620. The gain medium 606 provides light amplification. Each SRFP resonator 622A, 622B cavity includes waveguides $\{q\}$ and $\{q+2\}$ with $q=\{2,5\}$. These correspond to the left and right portions of each of the wavguides 624A and 624B from their respective coupling regions 604A and 604B. Each respective facet is the high reflection facet q 626A, 626B. Each SRFP resonator 622A, 622B has a uniform peak transmission at all resonant peaks. Their FSR is related to their optical length.

The two SRFP have slight different optical length, thus providing the mode selection and the wavelength tuning mechanism. Therefore, the two SRFP resonator 622A, 622B tuning technique (which is based on the Vernier technique) is achieved by aligning the peaks in the two sets of resonator combs with the adjustment of index in one or both SRFP resonators 622A, 622B.

The proposed device can be compared to both the known sampled grating-distributed Bragg reflector (SG-DBR) laser and to the double ring resonator coupled laser (DR-RCL). However, in the laser 620 uses SRFP resonators 622A, 622B on opposing sides of the length of gain medium 606. In contrast, SG-DBR lasers employ sampled gratings on opposite sides of a length of gain medium and DR-RCL uses ring resonators on opposite sides of a length of gain medium.

One advantage of the SRFP resonator over the standard ring resonator is its support of standing waves (and larger waveguide bending curvature as previously discussed). This allows the device the use of only one coupling region in order to couple light from the SRFP resonator back to the gain medium. Further, the advantage of the SRFP resonator over the standard Fabry-Perot resonator is the use of only one facet. This eases the fabrication constraints on the SRFP resonator; the length of the SRFP may greatly differ from that of the chip.

Thus, the FSR of the SRFP resonator is not strongly dictated by fabrication requirements as with conventional Fabry-Perot resonators. As SRFP resonators produce a substantially uniform peak transmission at all resonant peaks, the uniform thresholds and efficiencies between the different operating wavelengths are substantially the same. Consequently, the laser 620 of FIG. 6B and the DR-RCL are nearly analytically equivalent and, accordingly, the laser 620 should exhibit at least the same advantages in term of performance (such as tunability and MSR) as the DR-RCL if manufactured properly. In addition, the laser 620 exhibits additional positive features. For example, the laser 620 allow a reduction in the number of coupling regions as well as the elimination of absorption regions. Indeed, reflection problems related to the discontinuity between the absorption region and the passive waveguide in DR-RCL devices are avoided. The presence of a non perfect high reflection facet (i.e. $r_4 \neq 0$) does not appreciably deteriorate the resonator response. Also, as previously mentioned, the overall design has the advantage of planar fabrication and does require any grating structure or moving parts.

Analysis and modeling of the coupling between the gain medium and the resonator in the laser 620 build on the analysis related to the SRFP resonator, in section 2 above. The matrix form normalized complex field amplitude equations for coupling region 604A is as equation (3) in section 2, above. Similarly, the matrix form normalized complex field amplitude equations for coupling region 604B is as follows.

$$\begin{pmatrix} b_5 \\ b_6 \\ b_7 \\ b_8 \end{pmatrix} = \begin{pmatrix} 0 & 0 & t_5(f) & K_5(f) \\ 0 & 0 & -K_5(f)^* & t_5(f)^* \\ t_6(f) & K_6(f) & 0 & 0 \\ -K_6(f)^* & t_6(f)^* & 0 & 0 \end{pmatrix} \begin{pmatrix} a_5 \\ a_6 \\ a_7 \\ a_8 \end{pmatrix} \quad (27)$$

In the structure of FIG. 6A, from equations (3) and (27), $$\frac{b_2}{a_2} = -K_1^* R_3 [t_2 N + K_2] + t_1^* R_4 [-K_2^* N + t_2^*] \text{ and} \quad (28)$$

$$\frac{b_6}{a_6} = -K_5(f)^* R_7 [t_6 M + K_5] + t_5^* R_8 [-K_6^* M + t_6^*],$$

where,

-continued $$R_i = e^{-(2\alpha_i n_i L_i)} e^{j\frac{2\pi f}{c} 2 n_i L_i} r_i, \quad (29)$$

$$N = \frac{R_1 t_1 R_3 K_2 + K_1 R_4 t_2^*}{1 - R_1 t_1 R_3 K_2 + R_1 t_1 R_4 K_2^*} \text{ and}$$

$$M = \frac{R_5 t_5 R_7 K_6 + K_5 R_8 t_6^*}{1 - R_5 t_5 R_7 K_6 + R_5 t_5 R_8 K_6^*}$$

where $\alpha_i$, $n_i$ and $L_i$ are respectively, the loss per unit length, the refractive index and the length of the waveguide {i} and $r_i$ is the field reflectivity of the different facets as shown in FIG. 6B.

In the case of a tunable laser for WDM applications, one can neglect the frequency dependence of the coupling region over the working frequency range to obtain a rough approximation. Accordingly, it follows that, $$K_i = |K_i| e^{j\Phi_{ki}}, \; t_i, \; t_i = |t_i| e^{j\Phi_{ti}} \quad (11)$$

Figure 6C:
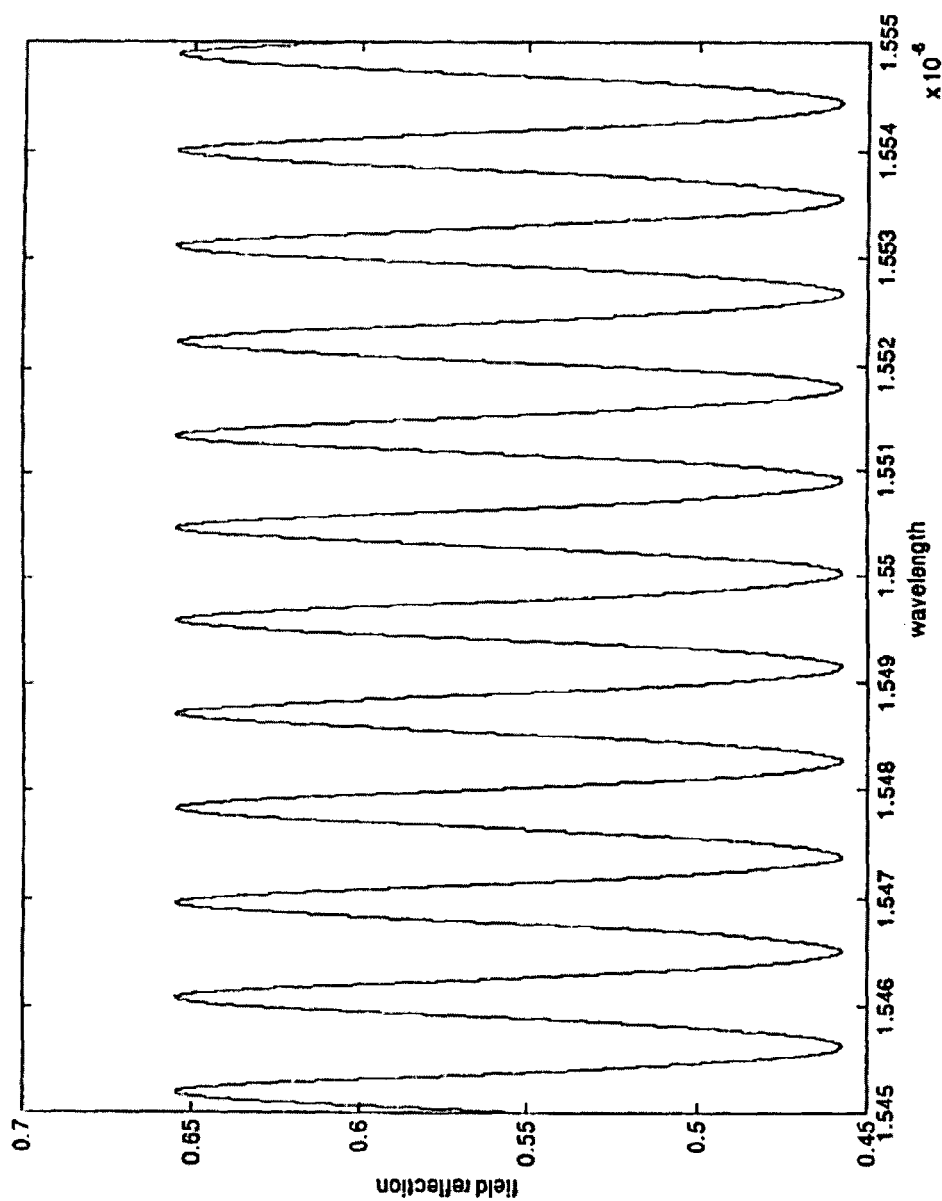
Figure 6D:
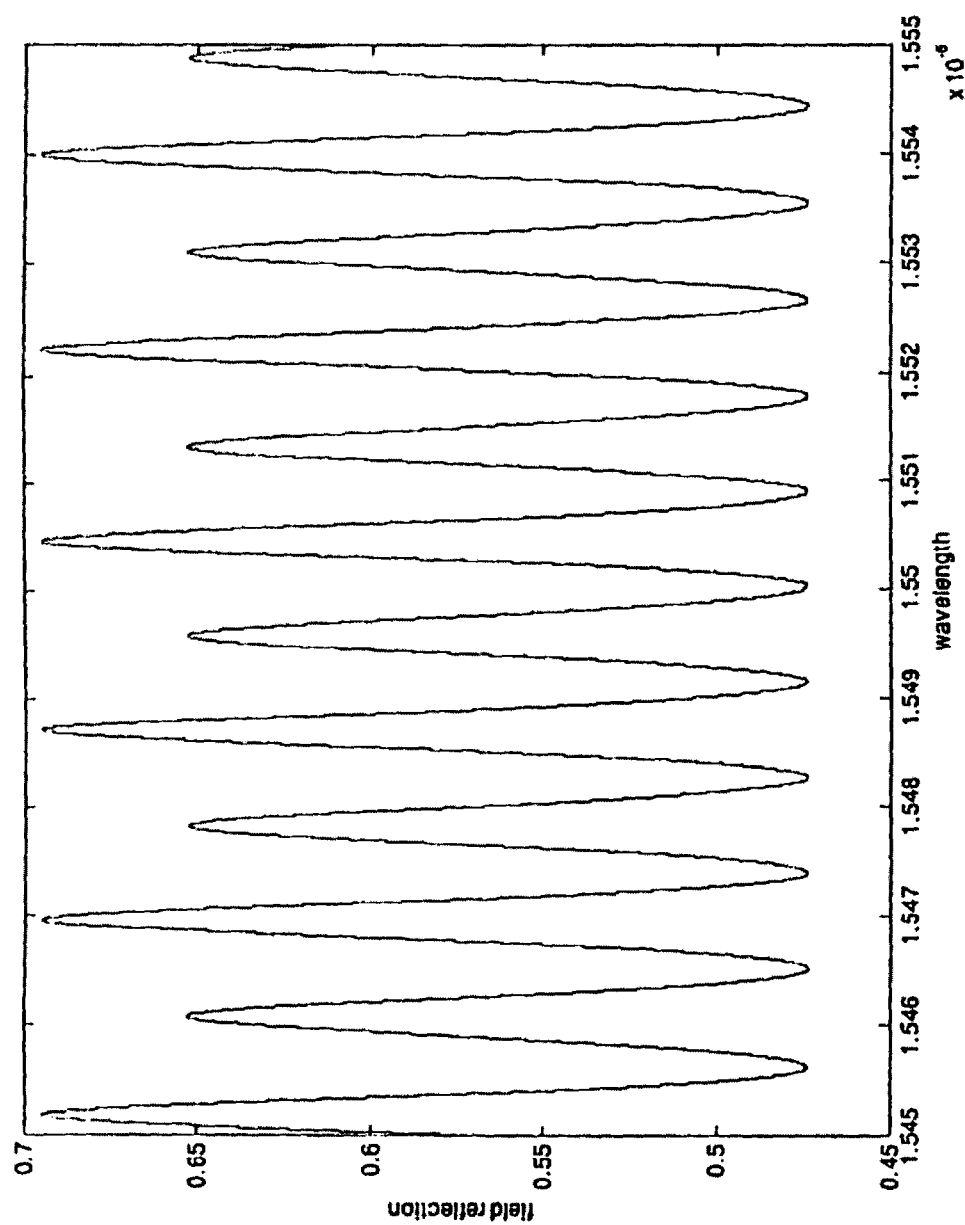
Figure 6E:
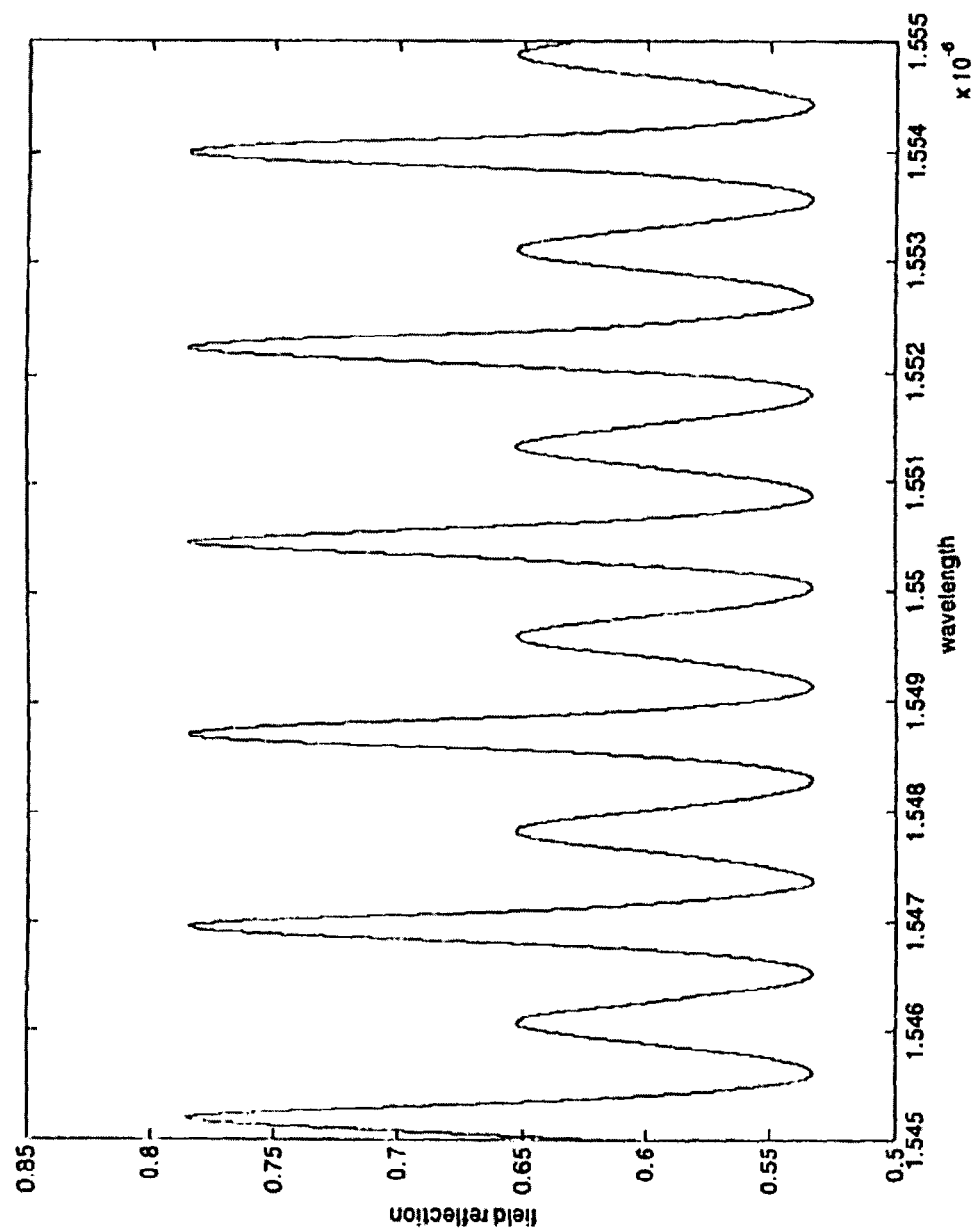

FIGS. 6B–6E are exemplary plots of the spectra of the light reflected from the resonator for different values of the back reflection coefficients ($r_1$, $r_8$), and high facet reflections ($r_2$, $r_4$, $r_5$, $r_7$). These plots demonstrate the effect of the coupling coefficient and the back reflection (that is, $r_1$, or $r_8$) on the laser 620. FIG. 6B represents $b_3/a_3$ versus wavelength in the case where $K_1=K_2=0.7$ and $r_1=0$, and a high reflection facet, $r_2=1$. FIG. 6C represents $b_3/a_3$ versus wavelength in the case where $K_1=K_2=0.7$ and $r_1=0$, and the high reflection facet $r_2=0.9$. FIG. 6D represents $b_3/a_3$ versus wavelength in the case where $K_1=K_2=0.7$ and $r_1=0.1$, and the high reflection facet $r_2=0.9$. FIG. 6E represents $b_3/a_3$ versus wavelength the case where $K_1=K_2=0.7$ and $r_1=0.4$, and the high reflection facet $r_2=0.9$.

Notably, FIG. 6D shows that presence of a non perfect high reflection facet ($r_1 \neq 0$, $r_8 \neq 0$) does appreciably deteriorate the resonator response. Also, as shown in FIG. 6F, the effect of a back reflection ($r_4$) is to improve the performance of the resonator in term of reflection $b_3/a_3$ and FSR (the spacing between two consecutive peaks of same intensity). Thus, the laser 620 offers the possibility of increasing the FSR of the resonator by merely changing the back reflection ($r_4$) instead of the resonator length. Also, even if there is a reflection returning to the gain medium directly from the coupling region, the laser 620 will operate correctly up to the point where this is equal to the reflection returning from the filter $b_3/a_3$.

5.2 A Laser Using Ring Resonators on Opposite Ends of the Gain Medium

FIG. 7 illustrates a laser 700 including two ring resonators 702A, 702B on opposing ends and adjacent to a length of gain medium 706, i.e. the towards the left and right ends of the gain medium 706. Previous lasers have employed a gain medium bounded by optical resonators such as gratings. The lasers use the Vernier effect for the tunability and described above. The lasing mode is the one that is a mode of both resonators 702A, 702B. The tunability of the laser 700 can be obtained by shifting the resonator modes of at least one of the two ring resonators 702A, 702B. Although FIG. 7 depicts the ring resonators 702A, 702B on opposite sides of the gain medium, i.e. above and below the length of gain medium 706, the ring resonators 702A, 702B can also be disposed on the same side together, either above or below the gain medium 706.

The tunable laser 700 can be monolithically fabricated from semiconductor materials using known processes. The laser 700 comprises of three primary regions, a gain medium 706, two passive ring resonators 702A, 702B and two facets 708A, 708B, one at each end of the laser 700. The laser 700 has the advantage that it readily lends itself to planar fabrication and does not require any grating structure or moving parts. The gain medium 706 provides light amplification and light is produced from the front facet 708B. The ring resonators 702A, 702B coupled to the gain medium through respective coupling regions 704A, 704B, have substantially uniform peak reflection at all resonant frequencies, and their free spectral range (FSR) is related to their optical length.

Tuning is based on the Vernier technique as described above. The present invention uses two ring resonators 702A, 702B with slightly different optical lengths, thus providing mode selection and a mechanism for wavelength tuning. Because of the slightly different optical lengths, the two sets of reflection peak combs have slightly different peak spacing. The tuning is accomplished by aligning the reflectivity peaks in the two sets of combs of from the ring resonators 702A, 702B. This can be accomplished in a number of ways. For example, tuning can be applied by manipulating the rear ring resonator 702A and employing the back reflection of the rear facet 708A (as described above for the single ring resonator laser 400 of FIG. 4A).

The laser 700 can be tuned by shifting the resonant frequencies of the ring resonators 702A and/or 702B. For example, tuning of the laser 700 can be obtained by changing combination of the resonant frequencies resulting from the ring resonator 702A and the back reflection from the rear facet 708A. Alternately, a shift can be obtained by changing the optical length (circumference) of the rings 702A and/or 702B or by changing the phase of the coupling coefficient of the coupling regions 704A and/or 704B between the gain medium 706 and the ring resonators 702A and/or 702B.

The Vernier technique is also applied in other known lasers, such as the sampled-grating distributed Bragg reflector (SG-DBR) lasers and double ring coupled lasers (DRCL). However, in SG-DBR lasers, front and back sampled gratings are used instead of the ring resonators 702A, 702B of the present invention. As compared to the DRCL, the laser 700 uses the back reflection of the rear facet 708A. As ring resonators 702A, 702B (as used in the laser 700) exhibit uniform peak reflection at all resonant peaks, the uniform thresholds and efficiencies between the different operating wavelengths are substantially the same. The laser 700 should exhibit the similar performance (in terms of tunability and MSR) as the DRCL.

Another advantage of the laser 700 as compared to the DRCL structure is that the laser 700 only uses a single coupling region 704A, 704B for each ring resonator 702A, 702B. In addition, the laser 700 does not employ any absorption regions as does the DRCL. Because there are no absorption regions, any reflection difficulties that would result from discontinuities between the absorption region and the passive waveguides of the ring resonators 702A, 702B are avoided. Also, it is desirable that the same field has tendency to travel more in to the ring structures in the present laser 700 than in the DRCL.

Those skilled in the art can apply the analytic framework in section 5.1 respecting a double SRFP laser to render a similar analysis for the current laser 700 using two ring resonators 702A, 702B.

Figure 8A:
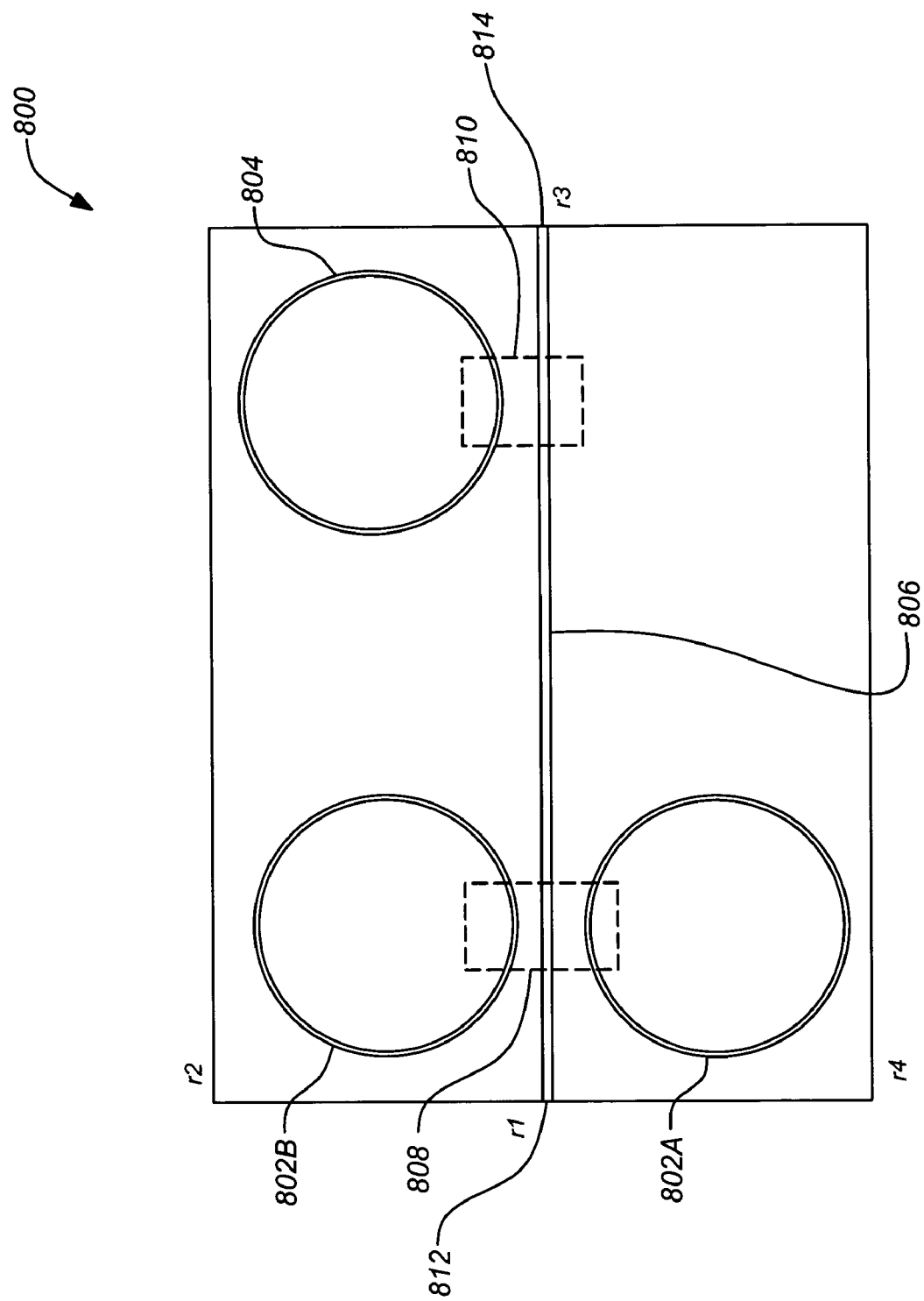
FIG. 8A illustrates an alternate embodiment where a pair of ring resonators are disposed on one side of a length of gain medium and a single ring resonator on the other.
Figure 8B:
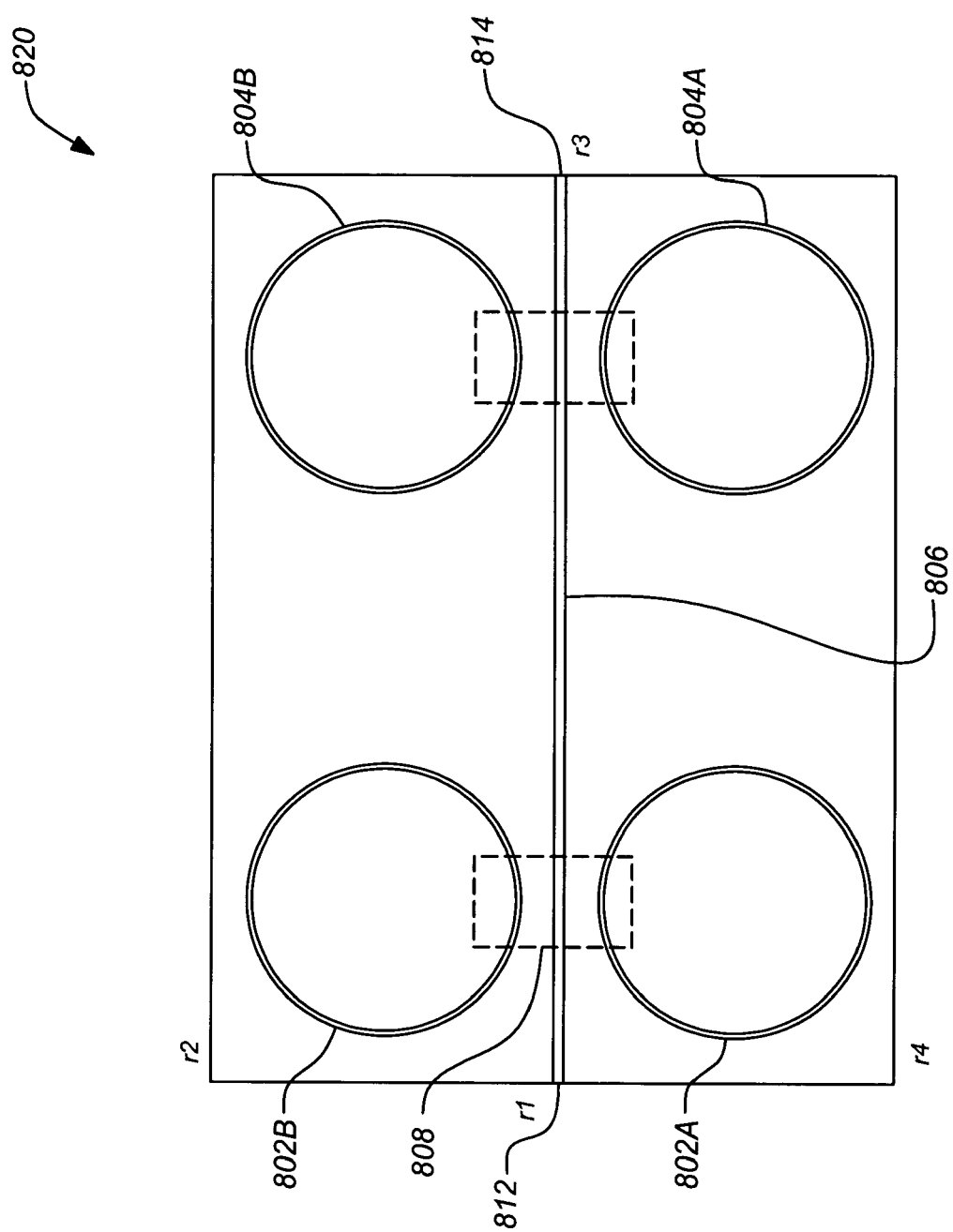
FIG. 8B illustrates an alternate embodiment where a pairs of ring resonators are disposed on each side of a length of gain medium.

5.3 Using Multiple Ring Resonators With Resonators Both Sides of the Gain Medium FIGS. 8A and 8B illustrate hybrids of the laser of FIG. 7. The embodiments of FIGS. 8A and 8B operate using a Vernier technique, similar to the class of lasers defined by FIG. 5A.

FIG. 8A illustrates an alternate embodiment 800 where a pair of ring resonators 802A, 802B are disposed on one side of a length of gain medium 806 and a single ring resonator 804 on the other. In this case, paired ring resonators 802A, 802B are used on one side of the length of the gain medium 806. A common coupling region 808 is used between the pair of ring resonators 802A, 802B and the gain medium 806. The coupling region 808 can be designed similar to the 3 by 3 coupling region employed in laser described in FIG. 4B. A third single ring resonator 804 is used on the opposite side of the length of the gain medium 806. A single coupling region 810 is used between the single ring resonator 804 and the gain medium. The combined reflection of the paired ring resonators 802A, 802B also employs a back reflection of the rear facet 812. Similarly, the reflection of the single ring resonator 804 employs the back reflection of the front facet 814. Lasing light is produced from the front facet 814. Alternately, the paired ring resonators 802A, 802B can be disposed adjacent to the front facet 814 and the single ring resonator 804 can be disposed adjacent to the rear facet 812.

FIG. 8B illustrates another alternate embodiment 820 where a pair of ring resonators 802A, 802B and 804A, 804B are disposed on either side of a length of gain medium 806. Paired resonators 802A, 802B are disposed on one side of the length of gain medium 806 and a second pair of resonators 804A, 804B are disposed on the opposite side of the length of gain medium 806. The combined reflection of the paired ring resonators 802A, 802B also employs a back reflection of the rear facet 812. Similarly, the reflection of the paired ring resonators 804A, 804B employs the back reflection of the front facet 814. Lasing light is produced from the front facet 814.

The foregoing description including the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the invention. Since many embodiments of the invention can be made without departing from the scope of the invention, the invention resides in the claims hereinafter appended.

What is claimed is:

1. A laser, comprising:
    a semiconductor medium having a front facet and a rear facet and including a lasing cavity;
    a gain medium disposed within the cavity of the semiconductor medium for amplifying light;
    a ring resonator disposed within the semiconductor medium adjacent to the gain medium; and
    a single coupling region for coupling the light between the gain medium and the ring resonator, the single coupling region disposed within the semiconductor medium;
    wherein a reflection from the ring resonator including a back reflection from the rear facet is tuned to the lasing cavity to produce lasing light from the front facet.

2. The laser of claim 1, wherein the laser is monolithically fabricated.

3. The laser of claim 1, wherein the laser cavity is formed between the front facet and the rear facet of the semiconductor medium.

4. The laser of claim 1, wherein the laser is tuned by shifting resonant frequencies of the ring resonator.

5. The laser of claim 1, wherein the laser is tuned by changing an optical length of the ring resonator.

6. The laser of claim 1, wherein the laser is tuned by changing a phase of a coupling coefficient of the single coupling region.

7. The laser of claim 1, further comprising an additional ring resonator coupled to the single coupling region and the reflection includes a response from the additional ring resonator.

8. The laser of claim 1, further comprising an opposing ring resonator disposed within the semiconductor medium adjacent to the gain medium towards an opposite end of the gain medium; and
- an opposing single coupling region for coupling the light between the gain medium and the opposing ring resonator, the opposing single coupling region disposed within the semiconductor medium;
- wherein a second reflection from the opposing ring resonator including a second back reflection from the front facet is produced and the laser is tuned employing a Vernier technique between the ring resonator and the opposing ring resonator.

9. The laser of claim 8, wherein the laser is tuned by shifting resonant frequencies of at least one of the ring resonator and the opposing ring resonator.

10. The laser of claim 8, wherein the laser is tuned by changing an optical length of at least one of the ring resonator and the opposing ring resonator.

11. The laser of claim 8, wherein the laser is tuned by changing a phase of a coupling coefficient of at least one of the single coupling region and the opposing single coupling region.

12. The laser of claim 8, further comprising at least one additional ring resonator coupled to at least one of the coupling region and the opposing coupling region.

13. The laser of claim 12, wherein both the coupling region and the opposing coupling region are each coupled to an additional ring resonator.

14. A laser, comprising:
- a gain medium for amplifying light across a gain bandwidth; and
- a semiconductor medium including:
  - a first reflector element coupled to receive light from the gain medium and comprising a first Mach-Zehoder interferometer (MZI) and a second MZI coupled in series, the first MZI having a larger free spectral range and the second MZI having a smaller free spectral range; and
  - a second reflector element for receiving light from the first reflector element and returning the light to the first reflector element;
- wherein the first MZI selects a wavelength region within the gain bandwidth and the second MZI selects a cavity mode within the wavelength region for producing lasing light at the cavity mode.

15. The laser of claim 14, wherein the second reflector element comprises a loop.

16. The laser of claim 14, wherein the second reflector element comprises a cleaved facet of the semiconductor medium.

17. The laser of claim 14, wherein the semiconductor medium comprises silicon.

18. The laser of claim 14, wherein a separate gain chip includes the gain medium coupled to the semiconductor medium.

* * * * *